(12) United States Patent
Ando et al.

(10) Patent No.: US 10,236,217 B1
(45) Date of Patent: Mar. 19, 2019

(54) STACKED FIELD-EFFECT TRANSISTORS (FETS) WITH SHARED AND NON-SHARED GATES

(71) Applicant: International Business Machines Corporation, Armonk, NY (US)

(72) Inventors: Takashi Ando, Tuckahoe, NY (US); Pouya Hashemi, White Plains, NY (US); Choonghyun Lee, Renesselaer, NY (US); Alexander Reznicek, Troy, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/802,062

(22) Filed: Nov. 2, 2017

(51) Int. Cl.

| H01L 21/8238 | (2006.01) |
| H01L 27/092 | (2006.01) |
| H01L 29/78 | (2006.01) |
| H01L 29/40 | (2006.01) |
| H01L 29/66 | (2006.01) |
| H01L 29/06 | (2006.01) |
| H01L 21/306 | (2006.01) |
| H01L 21/3065 | (2006.01) |
| H01L 21/311 | (2006.01) |

(52) U.S. Cl.
CPC ........ *H01L 21/823821* (2013.01); *H01L 21/82385* (2013.01); *H01L 21/823814* (2013.01); *H01L 21/823842* (2013.01); *H01L 21/823871* (2013.01); *H01L 27/0924* (2013.01); *H01L 21/3065* (2013.01); *H01L 21/30604* (2013.01); *H01L 21/31116* (2013.01); *H01L 29/0673* (2013.01); *H01L 29/401* (2013.01); *H01L 29/6653* (2013.01); *H01L 29/6681* (2013.01); *H01L 29/66553* (2013.01); *H01L 29/7853* (2013.01)

(58) Field of Classification Search
CPC .................................................. H01L 21/8238
See application file for complete search history.

(56) References Cited

U.S. PATENT DOCUMENTS

| 9,356,027 | B1 | 5/2016 | Cheng et al. |
| 9,659,963 | B2 | 5/2017 | Cheng et al. |
| 9,837,414 | B1 | 12/2017 | Balakrishnan et al. |
| 2016/0380002 | A1 | 12/2016 | Cheng et al. |
| 2017/0133507 | A1 | 5/2017 | Cheng et al. |

*Primary Examiner* — Marvin Payen
(74) *Attorney, Agent, or Firm* — L. Jeffrey Kelly; Ryan, Mason & Lewis, LLP

(57) ABSTRACT

A semiconductor device includes a plurality of stacked gate regions spaced apart from each other on a substrate, a plurality of first epitaxial source/drain regions between the plurality of stacked gate regions, wherein the first epitaxial source/drain regions extend from sides of the plurality of stacked gate regions in a first doped region, a plurality of second epitaxial source/drain regions between the plurality of stacked gate regions and positioned over the first epitaxial source/drain regions, wherein the second epitaxial source/drain regions extend from sides of the plurality of stacked gate regions in a second doped region, and a contact region extending through a second epitaxial source/drain region of the plurality of second epitaxial source/drain regions to a first epitaxial source/drain region of the plurality of first epitaxial source/drain regions.

17 Claims, 22 Drawing Sheets

STACKED FIELD-EFFECT TRANSISTORS (FETS) WITH SHARED AND NON-SHARED GATES

BACKGROUND

Nanowires and nanosheets are relatively thin wires or sheets, for example, with dimensions measured in nanometers (nm). Nanowires are circular or square shaped or approximately circular or square shaped in cross-section and have diameters or widths such as, for example, less than about 5 nm or 10 nm. A nanowire typically has a width that is equal or substantially equal to its height. Nanosheets are elliptical or rectangular shaped, or approximately elliptical or rectangular shaped in cross section and have thicknesses or heights such as, for example, less than about 5 nm or 10 nm. The width of a nanosheet may be considerably larger than this height, such as about 20 nm to about 60 nm in the case of a nanosheet which is about 4 nm to about 8 nm in height. The thickness of a nanosheet layer, or height of the rectangle in cross section, affects the electrostatics of the nanosheet.

Nanowire and nanosheet devices can be viable device options instead of fin field-effect transistors (FinFETs). For example, nanowires or nanosheets can be used as the fin structure in a dual-gate, tri-gate or gate-all-around (GAA) FET device. Complementary metal-oxide semiconductor (CMOS) scaling can be enabled by the use of stacked nanowires and nanosheets, which offer superior electrostatics and higher current density per footprint area than FinFETs. Three-dimensional (3D) integration by stacking N and PMOSFETs is a viable approach for 3 nm node and beyond for area scaling. In addition to area scaling, stacking combined with nanosheet or nanowire technology can provide beneficial device electrostatics control. Nanowire current density per footprint is less than that of nanosheets because current is proportional to the perimeter of the wire or sheet. Nanowires may have slightly better electrostatics than nanosheets, while nanosheets may exhibit higher current per footprint and less parasitic capacitance than nanowires.

SUMMARY

According to an exemplary embodiment of the present invention, a method for manufacturing a semiconductor device includes forming a stacked configuration of silicon germanium and silicon layers on a semiconductor substrate, wherein the stacked configuration comprises a repeating arrangement of a silicon layer stacked on a silicon germanium layer, patterning the stacked configuration into a plurality of patterned stacks spaced apart from each other, covering exposed sides of the silicon germanium layers in the plurality of patterned stacks with a dielectric, growing a plurality of epitaxial source/drain regions between the plurality of patterned stacks, wherein the epitaxial source/drain regions are grown from exposed sides of the silicon layers in the plurality of patterned stacks, selectively removing the silicon germanium layers from the plurality of patterned stacks, replacing the removed silicon germanium layers with respective gate regions, and forming a contact region to an epitaxial source/drain region of the plurality of epitaxial source/drain regions between the plurality of patterned stacks.

According to an exemplary embodiment of the present invention, a semiconductor device includes a plurality of stacked gate regions spaced apart from each other on a substrate, a plurality of first epitaxial source/drain regions between the plurality of stacked gate regions, wherein the first epitaxial source/drain regions extend from sides of the plurality of stacked gate regions in a first doped region, a plurality of second epitaxial source/drain regions between the plurality of stacked gate regions and positioned over the first epitaxial source/drain regions, wherein the second epitaxial source/drain regions extend from sides of the plurality of stacked gate regions in a second doped region, and a contact region extending through a second epitaxial source/drain region of the plurality of second epitaxial source/drain regions to a first epitaxial source/drain region of the plurality of first epitaxial source/drain regions.

According to an exemplary embodiment of the present invention, a method for manufacturing a semiconductor device includes forming a stacked nanosheet or nanowire configuration of first and second semiconductor layers on a semiconductor substrate, wherein the stacked configuration comprises a repeating arrangement of a second semiconductor layer stacked on a first semiconductor layer, patterning the stacked configuration into a plurality of patterned stacks spaced apart from each other, covering exposed sides of the first semiconductor layers in the plurality of patterned stacks with a dielectric, growing a plurality of epitaxial source/drain regions between the plurality of patterned stacks, wherein the epitaxial source/drain regions are grown from exposed sides of the second semiconductor layers in the plurality of patterned stacks, selectively removing the first semiconductor layers from the plurality of patterned stacks, replacing the removed first semiconductor layers with respective gate regions, and forming a contact region to an epitaxial source/drain region of the plurality of epitaxial source/drain regions between the plurality of patterned stacks.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
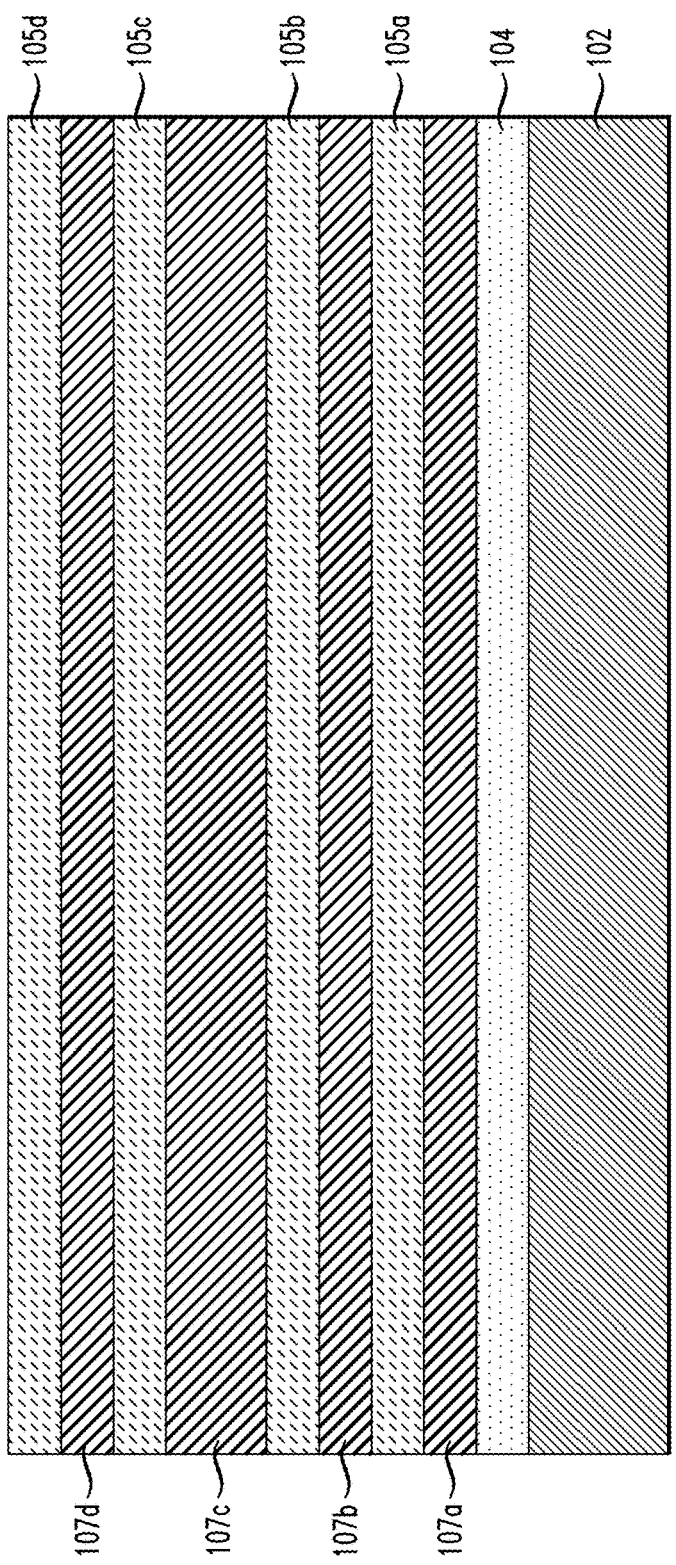
FIG. 1 is a schematic cross-sectional view illustrating manufacturing of a transistor device and showing formation of a stacked structure of silicon (Si) and silicon germanium (SiGe) nanosheet or nanowire layers on a doped punch-through stop layer on a semiconductor substrate, according to an embodiment of the invention.

Exemplary embodiments of the invention will now be discussed in further detail with regard to semiconductor devices and methods of manufacturing same and, in particular, to fabrication of both shared and non-shared gate structures.

It is to be understood that the various layers and/or regions shown in the accompanying drawings are not drawn to scale, and that one or more layers and/or regions of a type commonly used in, for example, complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, CMOSs, MOSFETs, nanowire FETs, nanosheet FETs and/or FinFETs. By way of non-limiting example, the semiconductor devices can include, but are not limited to FET, CMOS, MOSFET, nanowire FET, nanosheet FET and FinFET devices, and/or semiconductor devices that use FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention relate to methods and structures to integrate non-shared and shared gates for stacked FETs, such as nanosheet or nanowire FETs. For non-shared gate devices, a method and structure in accordance with an embodiment of the present invention converts a top device to an inactive device and is compatible with the processing flow of shared gate devices.

FIG. 1 is a schematic cross-sectional view illustrating manufacturing of a transistor device and showing formation of a stacked structure of silicon (Si) and silicon germanium (SiGe) nanosheet or nanowire layers on a doped punch-through stop layer on a semiconductor substrate, according to an embodiment of the invention. Referring to FIG. 1, a semiconductor substrate 102 comprises semiconductor material including, but not limited to, silicon (Si), silicon germanium (SiGe), silicon carbide (SiC), silicon germanium carbide (SiGeC), II-V compound semiconductor or other like semiconductor. In addition, multiple layers of the semiconductor materials can be used as the semiconductor material of the substrate.

In accordance with an embodiment of the present invention, the substrate 102 comprises a bulk silicon substrate. Formed on substrate 102 is a doped punch-through stop (PTS) layer 104. The doped PTS layer 104 can be formed by a PTS doping process to create the PTS layer 104 having a PTS doped region. The doped PTS layer 104 comprises, for example, doped silicon and can prevent leakage current. In a non-limiting illustrative example, the doping of the PTS layer 104 uses, for example, arsenic (As) or phosphorous (P) for p-type and boron (B) for n-type, at concentrations in the general range of 5e18/cm3 to 5e19/cm3 to stop the leakage. A thickness of the doped PTS layer 104 can be approximately 10 nm to about 100 nm.

Layers of silicon germanium 107a, 107b, 107c and 107d and silicon 105a, 105b, 105c and 105d are epitaxially grown in an alternating and stacked configuration on the PTS layer 104, so that a first SiGe layer 107a is followed a first Si layer 105a on the first SiGe layer 107a, which is followed by a second SiGe layer 107b on the first Si layer 105a, and so on. While four Si layers 105a-d and four SiGe layers 107a-d are shown, the embodiments of the present invention are not necessarily limited to the shown number of layers 105, 107, and there may be more or less layers in the same alternating configuration depending on design constraints.

Referring to FIG. 1, in a non-limiting illustrative embodiment, a first SiGe layer 107a of a SiGe/Si nanosheet stack is formed on the substrate 102 by epitaxial growth. In accordance with an embodiment of the present invention, the layers 107a-d include, for example, germanium at a 30% concentration, but are not necessarily limited thereto. Other concentrations of germanium can also be used. Alternative materials may be used that have the property of being removed selectively compared to the nanosheet channel material, which, according to an embodiment, is silicon (e.g., layers 105a-105d).

In a non-limiting illustrative embodiment, a height of the layers 107a, 107b and 107d can be in the range of about 10 nm-about 30 nm depending on the application of the device. The height of layer 107c is more than that of 107a, 107b and 107d because layer 107c corresponds to an area where differently doped FETs are stacked on each other, and allows for formation of dielectric layers to isolate epitaxial source/drain regions of the complementary FETs. The height of layer 107c can be in the range of about 20 nm-about 50 nm.

In a non-limiting illustrative embodiment, a first silicon layer 105a of the SiGe/Si nanosheet stack is formed on the first SiGe layer 107a by epitaxial growth. In accordance with an embodiment of the present invention, the layers 105a-105d include the same or a similar composition to the substrate 102. In a non-limiting example, a height of the layers 105a-105d can be in the range of about 2 nm-about 15 nm depending on the desired process and application.

Additional SiGe and silicon layers 107b-d, 105b-d in a stacked configuration to form the remaining SiGe and silicon layers are formed on the first (lower) silicon layer 105a by epitaxial growth. In accordance with an embodiment of the present invention, each of the layers 105a-d has the same or substantially the same composition and size as each other, and each of the layers 107a-d has the same or substantially the same composition and size (with the exception of thicker layer 107c) as each other.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a PECVD apparatus. A number of different sources may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, ldisilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking. By "in-situ" it is meant that the dopant that dictates the conductivity type of the doped layer is introduced during the process step, e.g., epitaxial deposition, that forms the doped layer.

Figure 2:
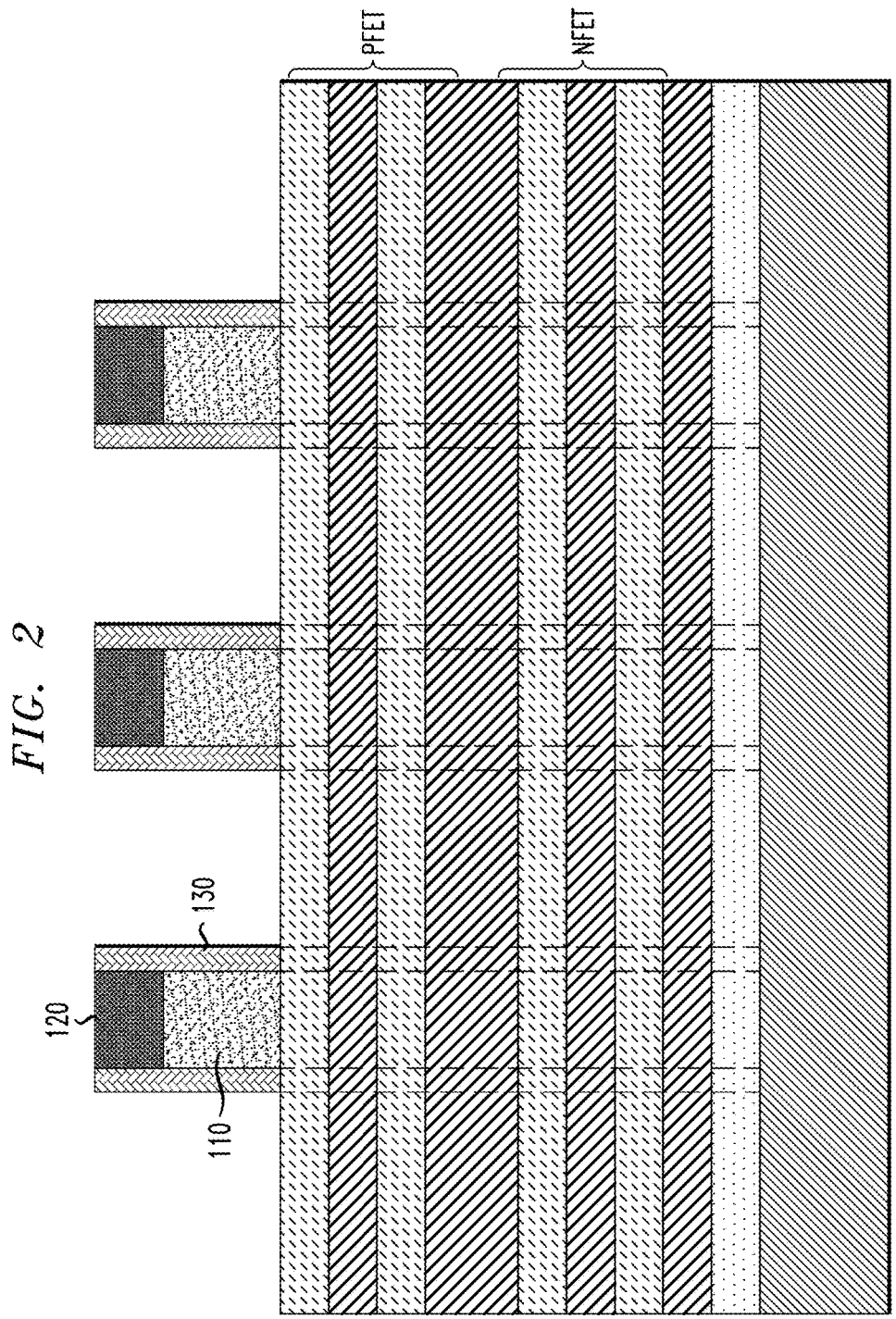
FIG. 2 is a schematic cross-sectional view illustrating manufacturing of a transistor device and showing formation of dummy gates and spacers, according to an embodiment of the invention.

FIG. 2 is a schematic cross-sectional view illustrating manufacturing of a transistor device and showing formation of dummy gates and spacers, according to an embodiment of the invention. Referring to FIG. 2, dummy gate material, including, but not necessarily limited to, polysilicon, amorphous silicon, or a dielectric material such as, for example, oxide or silicon nitride, is deposited on and around the stacked configuration of Si and SiGe using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating, followed by a planarization process, such as, chemical mechanical polishing (CMP), and lithography and etching steps to remove excess dummy gate material, and pattern the deposited layers into dummy gates 110 in what is to become device channel regions.

Hard mask layers 120 are formed on top of the dummy gates 110, which can be formed by one or more of the deposition techniques noted in connection with deposition of the dummy gate material. The hard mask material can comprise for example, silicon oxide, silicon nitride, silicon oxynitride, boron nitride, silicon boron nitride, or multilayered stacks thereof. According to an embodiment, a dielectric, such as, for example, silicon oxide, silicon nitride, silicon oxynitride, boron nitride, silicon boron nitride, or multilayered stacks thereof, is deposited conformally on the nanosheet or nanowire SiGe/Si stack, as well on sidewalls of the dummy gates 110 and hardmask layers 120, and on a top surface of the hardmask layers 120. The horizontal portions of the dielectric material are then removed, using, for example, etching, to form spacers 130. Deposition of the spacer material can be performed using one or more conformal deposition techniques including, but not necessarily limited to, CVD or ALD.

As shown in FIG. 2, an upper portion of the SiGe/Si stack corresponds to a PFET region, and a lower portion of the SiGe/Si stack corresponds to an NFET region. Alternatively, the upper portion of the SiGe/Si stack may correspond to an NFET region, and a lower portion of the SiGe/Si stack may correspond to a PFET region. The dotted lines in FIG. 2 illustrate the position of the spacers in cross-sections beyond the nanosheets or nanowires, but which are not shown when taking the cross-section somewhere in the wires.

Figure 3:
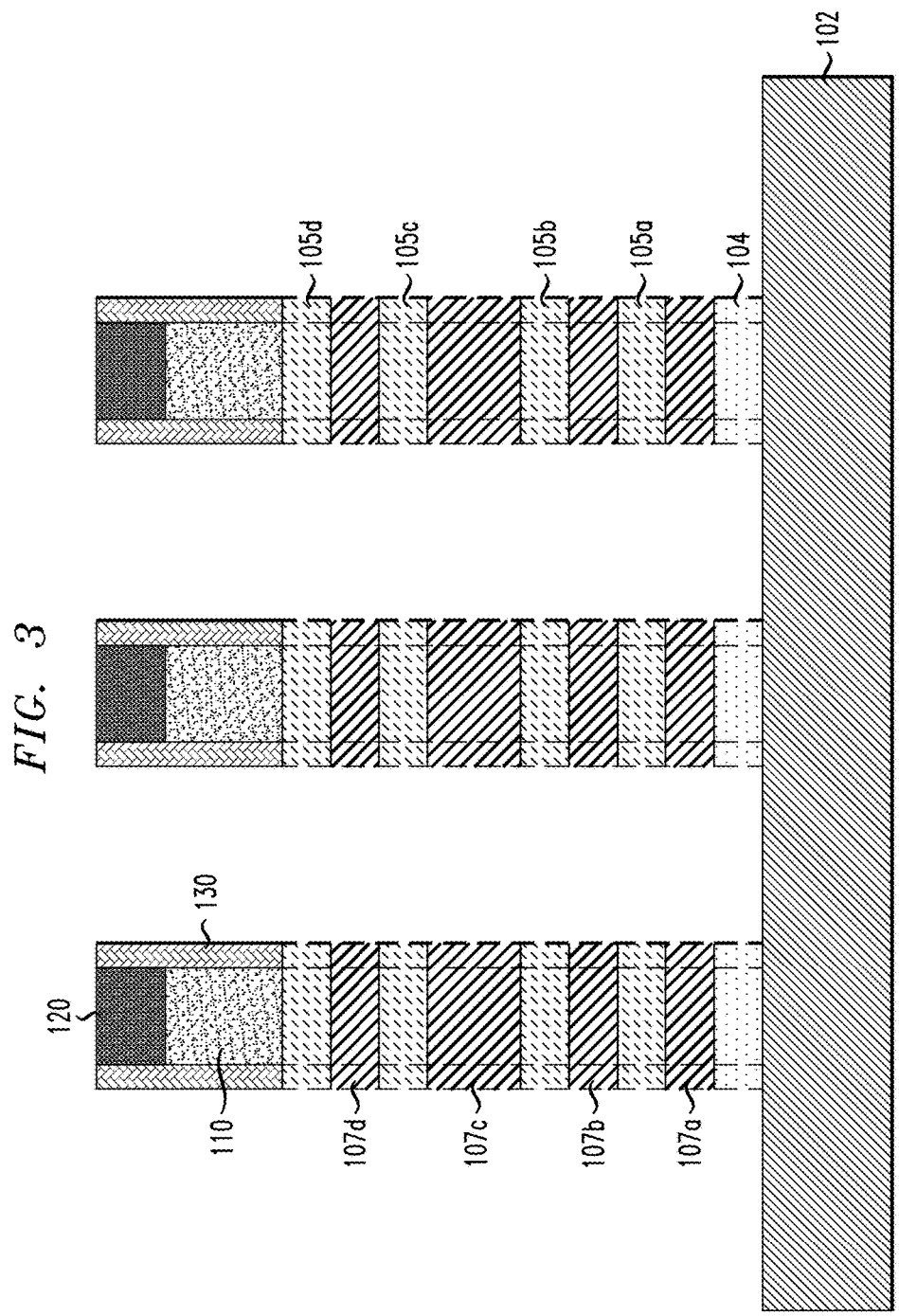
FIG. 3 is a schematic cross-sectional view illustrating manufacturing of a transistor device and showing patterning of the stacked nanosheet or nanowire layers, according to an embodiment of the invention.

FIG. 3 is a schematic cross-sectional view illustrating manufacturing of a transistor device and showing patterning of the stacked nanosheet or nanowire layers, according to an embodiment of the invention. Referring to FIG. 3, exposed portions of the stacked nanosheet or nanowire layers, which are not under the spacer, hardmask and dummy gate layers 130, 120 and 110, are removed using, for example, an etching process, such as reactive ion etching (RIE). As can be seen in FIG. 3, the spacer layers 130 on the sidewalls of the dummy gates 110 and the hardmask layers 120, and portions of the stacked nanosheets or nanowires under the spacer layers 130 and under the dummy gates 110 remain after the etching process, and portions of the stacked nanosheets or nanowires in areas that will correspond source/drain regions are removed.

Figure 4:
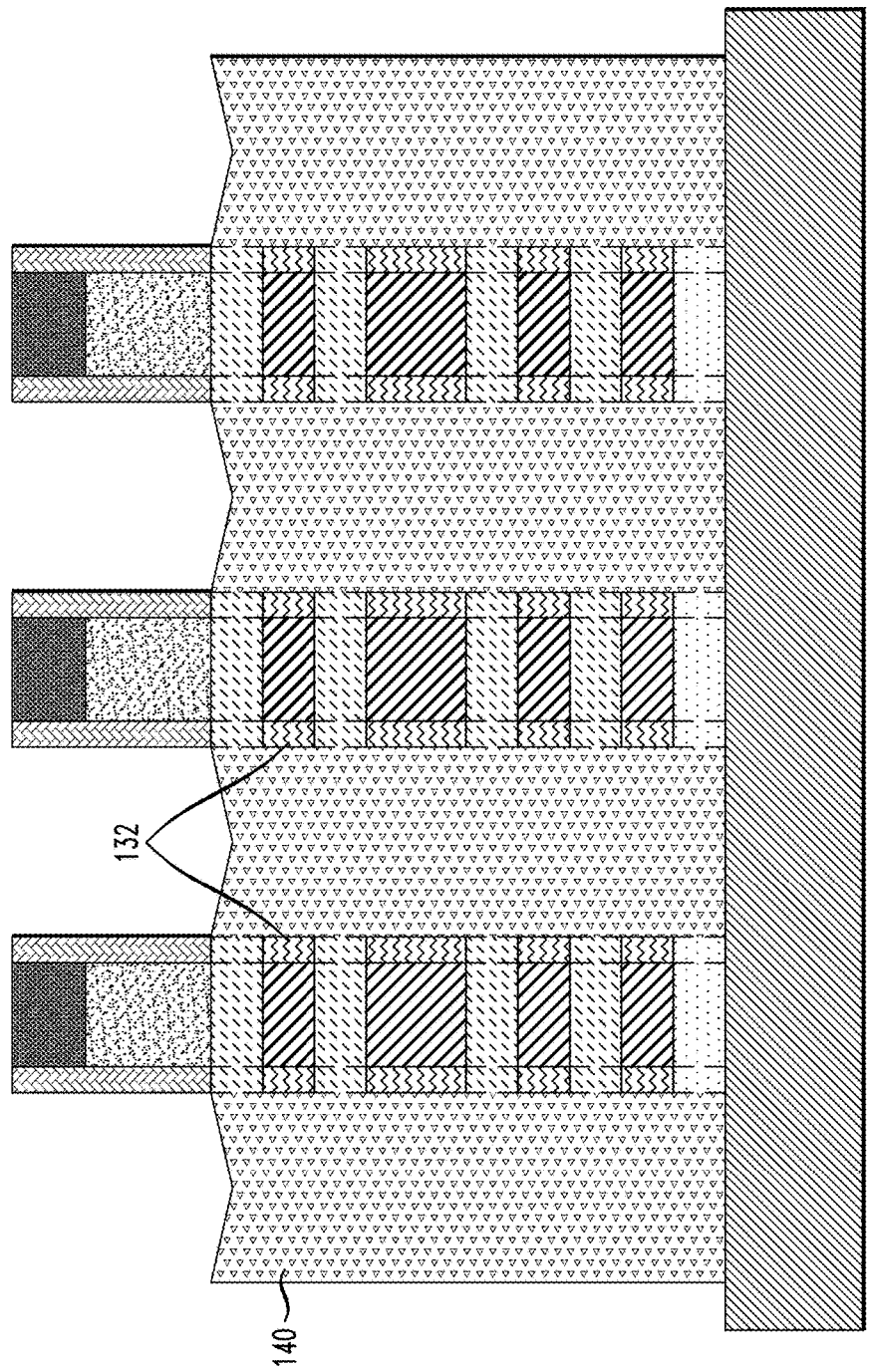
FIG. 4 is a schematic cross-sectional view illustrating manufacturing of a transistor device and showing formation of first source/drain epitaxial layers between the patterned stacks, according to an embodiment of the invention.

FIG. 4 is a schematic cross-sectional view illustrating manufacturing of a transistor device and showing formation of first source/drain epitaxial layers between the patterned stacks, according to an embodiment of the invention. Referring to FIG. 4, epitaxial source/drain layers 140 are laterally grown from the exposed silicon regions 105a-105d of the patterned Si/SiGe stacks. As explained further herein below, the epitaxial source/drain layers 140 become the source/drain regions for the lower devices (e.g., NFETs), and can comprise in-situ phosphorous doped (ISPD) Si:C, at concentrations of less than 2% for carbon, and 1e20 $cm^{-3}$-5e21 $cm^{-3}$ for phosphorus.

As shown in FIG. 4, prior to epitaxial growth, side portions of the SiGe layers 107a-107d are removed and replaced with spacers 132 so that the SiGe layers 107a-107d are covered during the epitaxial growth of the source/drain layers 140 and lateral epitaxial growth does not occur from the SiGe layers 107a-107d of the patterned stacks.

According to an embodiment, due to the germanium in layers 107a-107d, etching of the layers 107a-107d can be performed selective to layers 104 and 105a-105d, such that the side portions of the SiGe layers 107a-107d under the spacers 130 can be removed, while maintaining the side portions of the layers 104 and 105a-105d. The etching can be performed using, for example, $NH_4OH:H_2O_2$ solution.

In accordance with an embodiment of the present invention, the vacant portions left by removal of the side portions of the layers 107a-107d are filled in by deposition of dielectric material forming spacers 132. The spacers 132 include a dielectric, such as, for example, silicon oxide, silicon nitride, silicon oxynitride, boron nitride, silicon boron nitride, or multilayered stacks thereof to fill in the gaps left after etching side portions of the layers 107a-107d. The material of the spacers 132 can be the same or similar to the material of the spacers 130. Deposition of the spacers 132 can be performed using deposition techniques including, but not necessarily limited to, CVD, PECVD, RFCVD, PVD, ALD, MBD, PLD, and/or LSMCD, sputtering, and/or plating, followed by dry and wet etch processes to remove excess deposited material of the spacers 132. The wet etch process may be performed using, for example, diluted high temperature phosphoric acid and hydrofluoric (HF) acid to remove excess materials.

Figure 5:
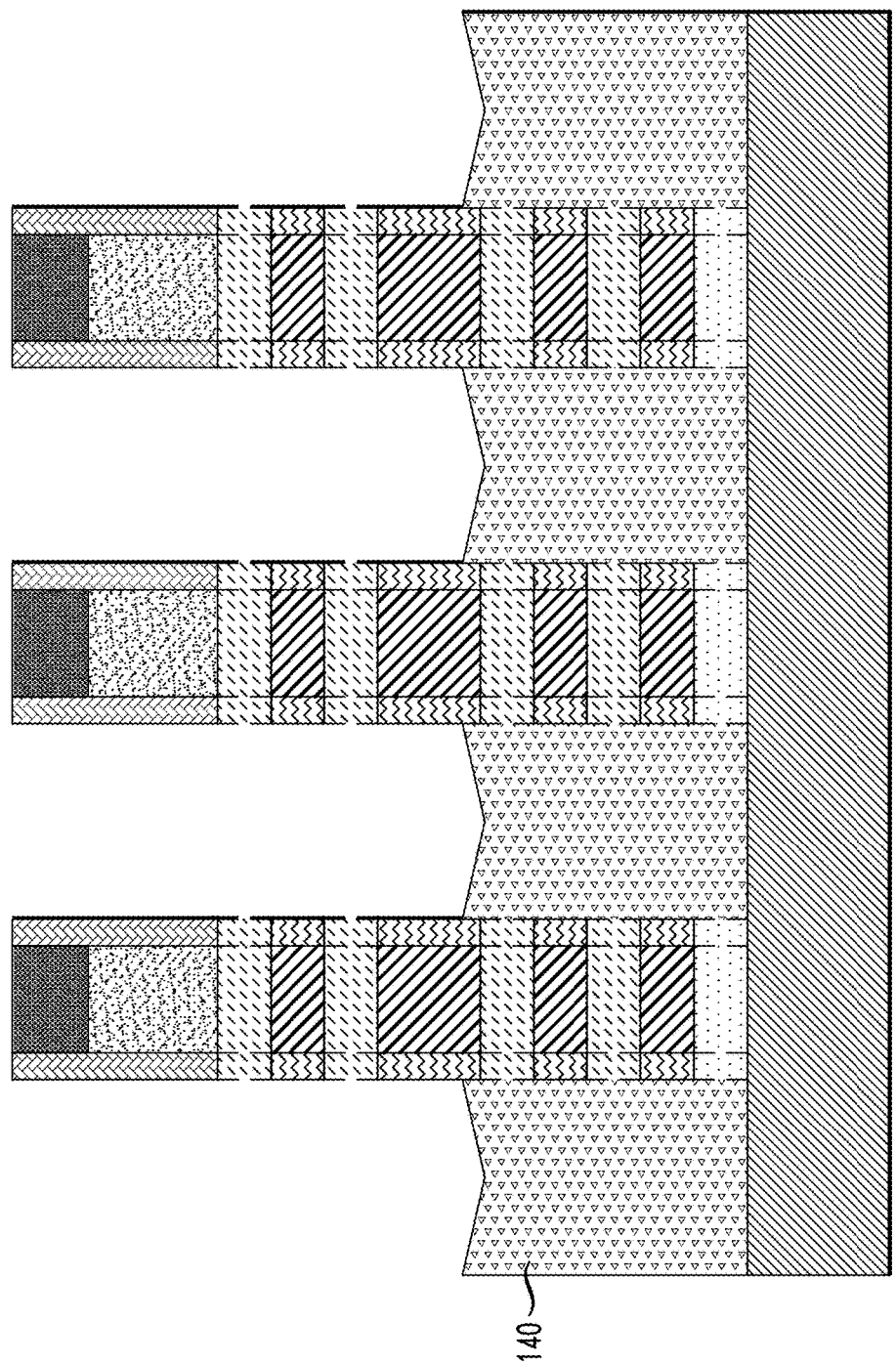
FIG. 5 is a schematic cross-sectional view illustrating manufacturing of a transistor device and showing recessing of the first source/drain epitaxial layers, according to an embodiment of the invention.

FIG. 5 is a schematic cross-sectional view illustrating manufacturing of a transistor device and showing recessing of the first source/drain epitaxial layers, according to an embodiment of the invention. Referring to FIG. 5, the source/drain epitaxial layer 140 is recessed down to an area which corresponds to the NFET region. The recessing is performed using, for example RIE with chlorine (Cl) or bromine (Br) based chemistry.

Figure 6:
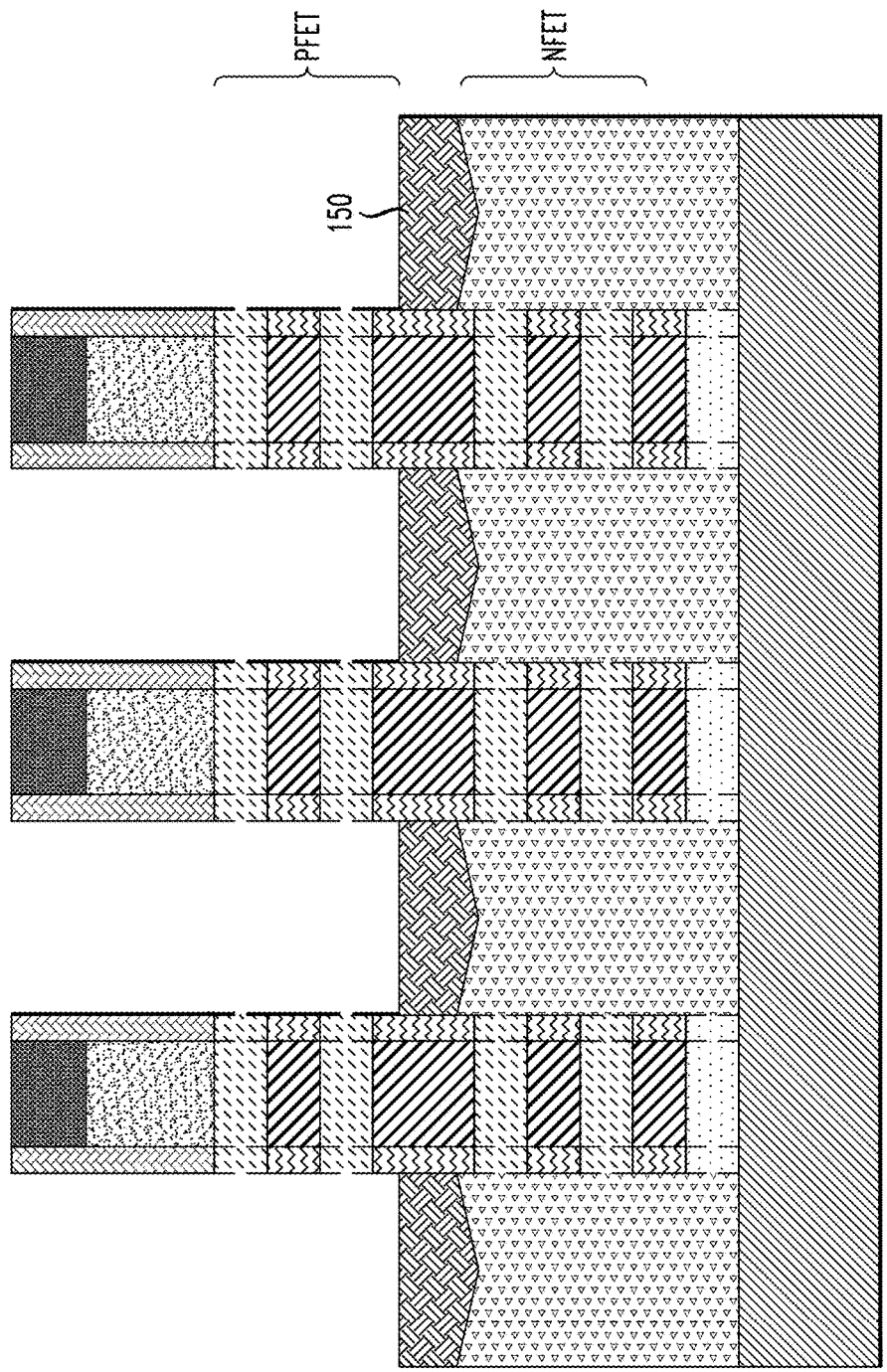
FIG. 6 is a schematic cross-sectional view illustrating manufacturing of a transistor device and showing formation of a dielectric layer that will separate complementary transistors, according to an embodiment of the invention.

FIG. 6 is a schematic cross-sectional view illustrating manufacturing of a transistor device and showing formation of a dielectric layer that will separate complementary transistors, according to an embodiment of the invention. Referring to FIG. 6, a dielectric layer 150, including, but not necessarily limited to, silicon dioxide (SiO$_2$), low-temperature oxide (LTO), high-temperature oxide (HTO), field oxide (FOX) or some other dielectric is deposited on the epitaxial source/drain layers 140. The dielectric layer 150 can be deposited using, for example, CVD, PECVD, RFCVD, PVD, ALD, MLD, MBD, PLD, LSMCD, and/or sputtering, followed by planarization by, for example, CMP, down to the hardmask layers 120. The dielectric layer 150 is then recessed using, for example, an etching process, to an area between NFET and PFET regions so that the dielectric layer can isolate the differently doped regions from each other. The recessing is performed using, for example hydrofluoric acid (HF) based solutions.

Figure 7:
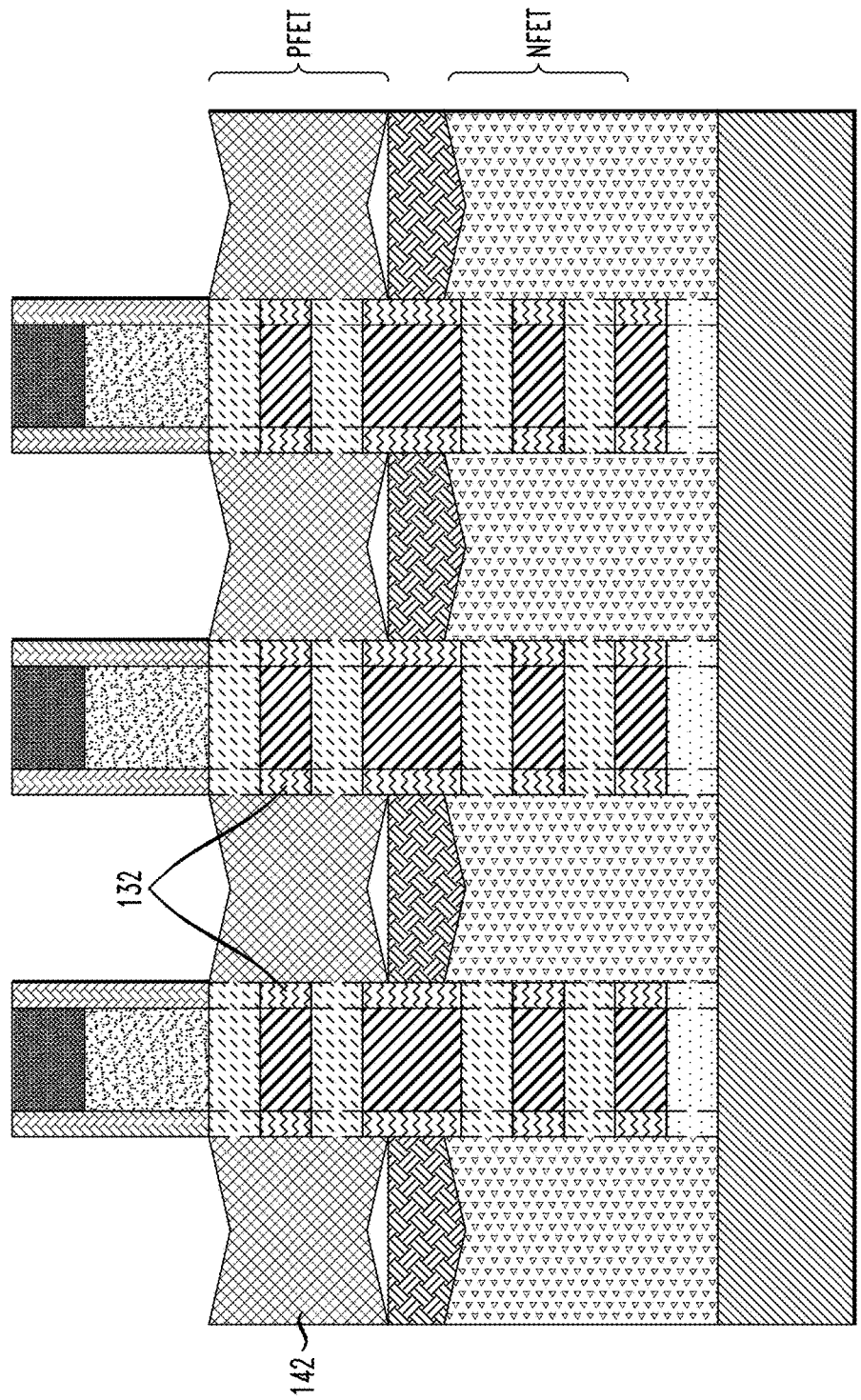
FIG. 7 is a schematic cross-sectional view illustrating manufacturing of a transistor device and showing formation of second source/drain epitaxial layers between the patterned stacks, according to an embodiment of the invention.

FIG. 7 is a schematic cross-sectional view illustrating manufacturing of a transistor device and showing formation of second source/drain epitaxial layers between the patterned stacks, according to an embodiment of the invention. Referring to FIG. 7, epitaxial source/drain layers 142 are laterally grown from the exposed silicon regions 105c-105d of the patterned Si/SiGe stacks. The epitaxial source/drain layers 142 become the source/drain regions for the upper devices (e.g., PFETs), and can comprise in-situ boron doped (ISBD) SiGe, with concentrations of Ge in the range of 10-100%, and boron in the range of 1e20 cm$^{-3}$-5e21 cm$^{-3}$.

As shown in FIG. 7, and explained herein above, prior to epitaxial growth, the side portions of the SiGe layers 107c-107d were removed and replaced with spacers 132 so that the SiGe layers 107c-107d are covered during the epitaxial growth of the source/drain layers 142 and lateral epitaxial growth does not occur from the SiGe layers 107c-107d of the patterned stacks. The epitaxial source/drain layers 142 are located on the dielectric layer, which isolates the differently doped regions (e.g., NFET and PFET) from each other.

Figure 8:
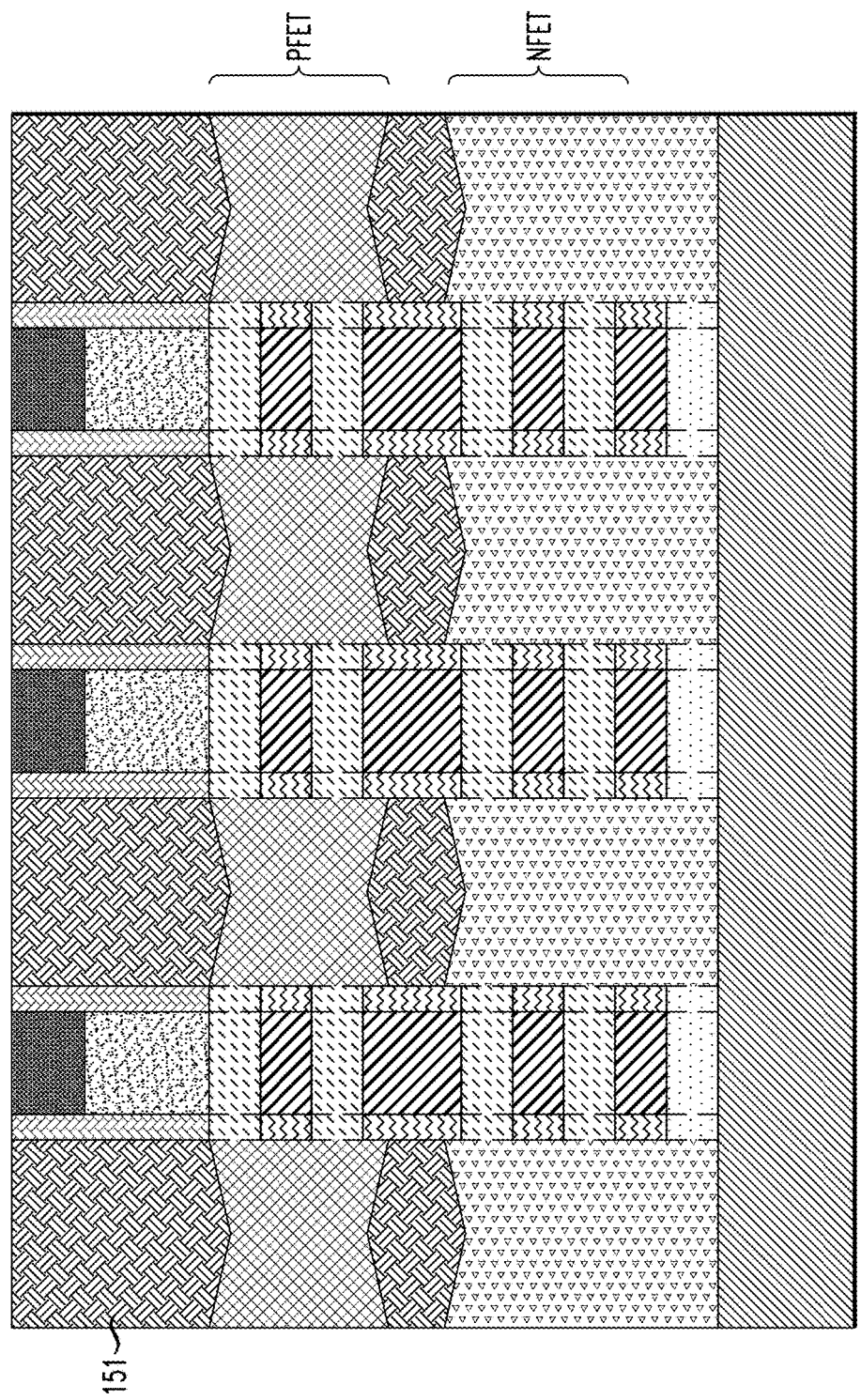
FIG. 8 is a schematic cross-sectional view illustrating manufacturing of a transistor device and showing formation of inter-layer dielectric (ILD) layers, according to an embodiment of the invention.

FIG. 8 is a schematic cross-sectional view illustrating manufacturing of a transistor device and showing formation of inter-layer dielectric (ILD) layers, according to an embodiment of the invention. Referring to FIG. 8, ILD layers 151, including, but not necessarily limited to, silicon dioxide (SiO$_2$), low-temperature oxide (LTO), high-temperature oxide (HTO), field oxide (FOX) or some other dielectric are deposited on the epitaxial source/drain layers 142 and in remaining spaces between the dielectric layer 150 and the epitaxial source/drain layers 142 to fill in the vacant areas between the patterned SiGe/Si stacks and the dummy gate and hardmask layers 110, 120. The ILD layers 151 can be deposited using, for example, CVD, PECVD, RFCVD, PVD, ALD, MLD, MBD, PLD, LSMCD, and/or sputtering, followed by planarization by, for example, CMP, down to the hardmask layers 120.

Figure 9:
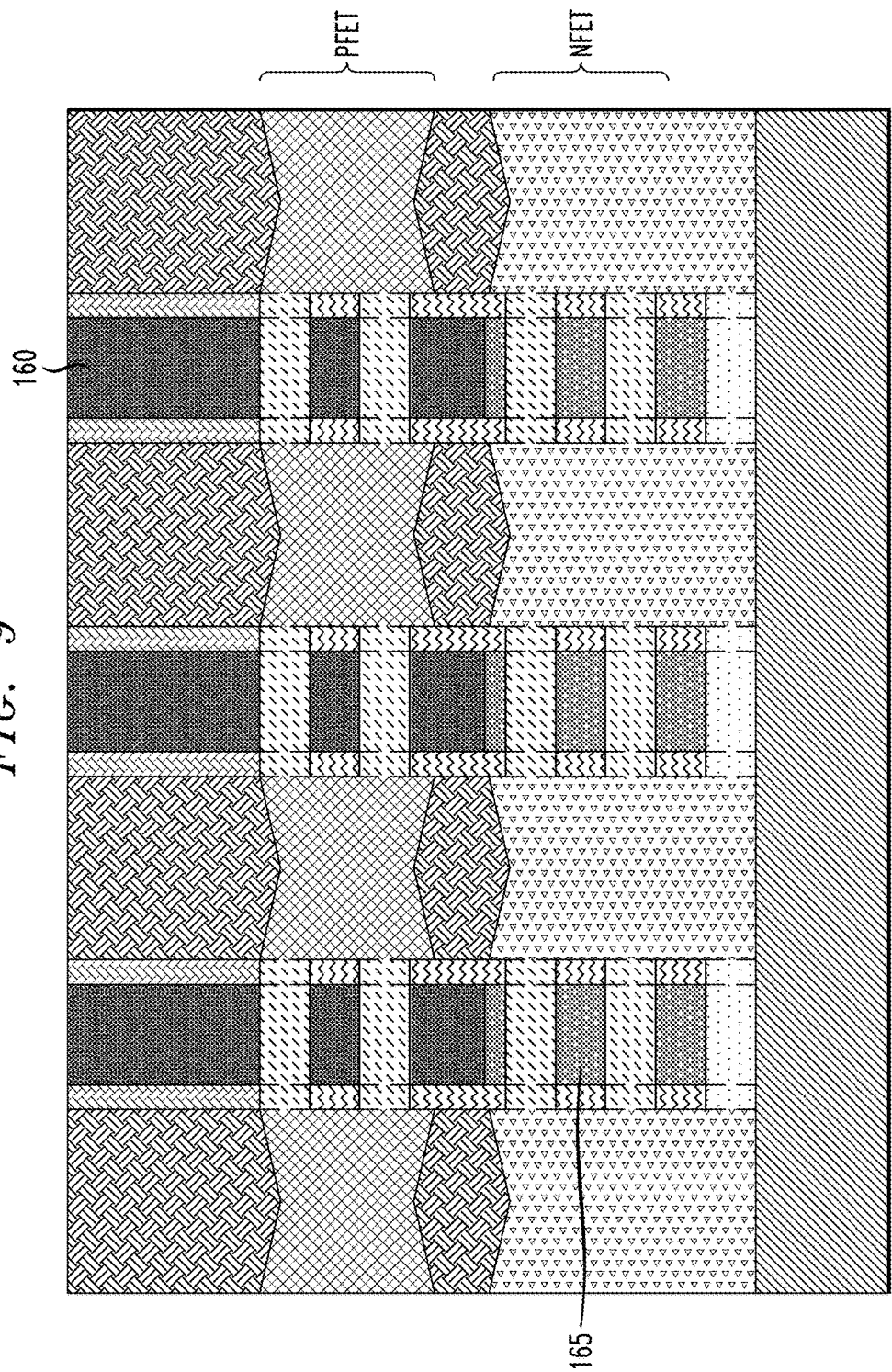
FIG. 9 is a schematic cross-sectional view illustrating manufacturing of a transistor device and showing formation of gate structures in place of removed dummy gates for complementary transistors, according to an embodiment of the invention.

FIG. 9 is a schematic cross-sectional view illustrating manufacturing of a transistor device and showing formation of gate structures in place of removed dummy gates for complementary transistors, according to an embodiment of the invention. Referring to FIG. 9, the hardmask layers 120, dummy gates 110 and SiGe layers 107a-107d are selectively removed. Then, the silicon nanosheets or nanowires 105a-105d are suspended, and the top and bottom gate regions 160, 165 for the respective PFET and NFET devices are formed in place of the removed hardmask layers 120, dummy gates 110 and SiGe layers 107a-107d. The suspension can be performed using wet or dry chemistries selective to Si. For the wet process, CH$_3$COOH:H$_2$O$_2$:HF chemistry can be used. For RIE, CF$_4$/O$_2$ based chemistry can be used. There are various other chemistries for both approaches that may be used.

In accordance with an embodiment of the present invention, the gate regions 160 and 165 each include a gate dielectric layer such as, for example, a high-K dielectric layer including, but not necessarily limited to, HfO$_2$ (hafnium oxide), ZrO$_2$ (zirconium dioxide), hafnium zirconium oxide, Al$_2$O$_3$ (aluminum oxide), and Ta$_2$O$_5$ (tantalum pentoxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate regions 160 and 165 each include a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer. The gate regions 160 and 165 each further include a gate layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer. As can be seen, the gate regions 160 and 165 differ from each other for the p- and n-doped regions. As noted above, the WFM layer differs for the p- and n-doped regions, and the material for the gate layer also differs between the gate regions 160 and 165 to result in dual/multi-work function structure.

The layers for the gate regions 160 and 165 can be deposited using, for example, CVD, PECVD, RFCVD, PVD, ALD, MLD, MBD, PLD, LSMCD, and/or sputtering, followed by planarization by, for example, CMP.

Figure 10:
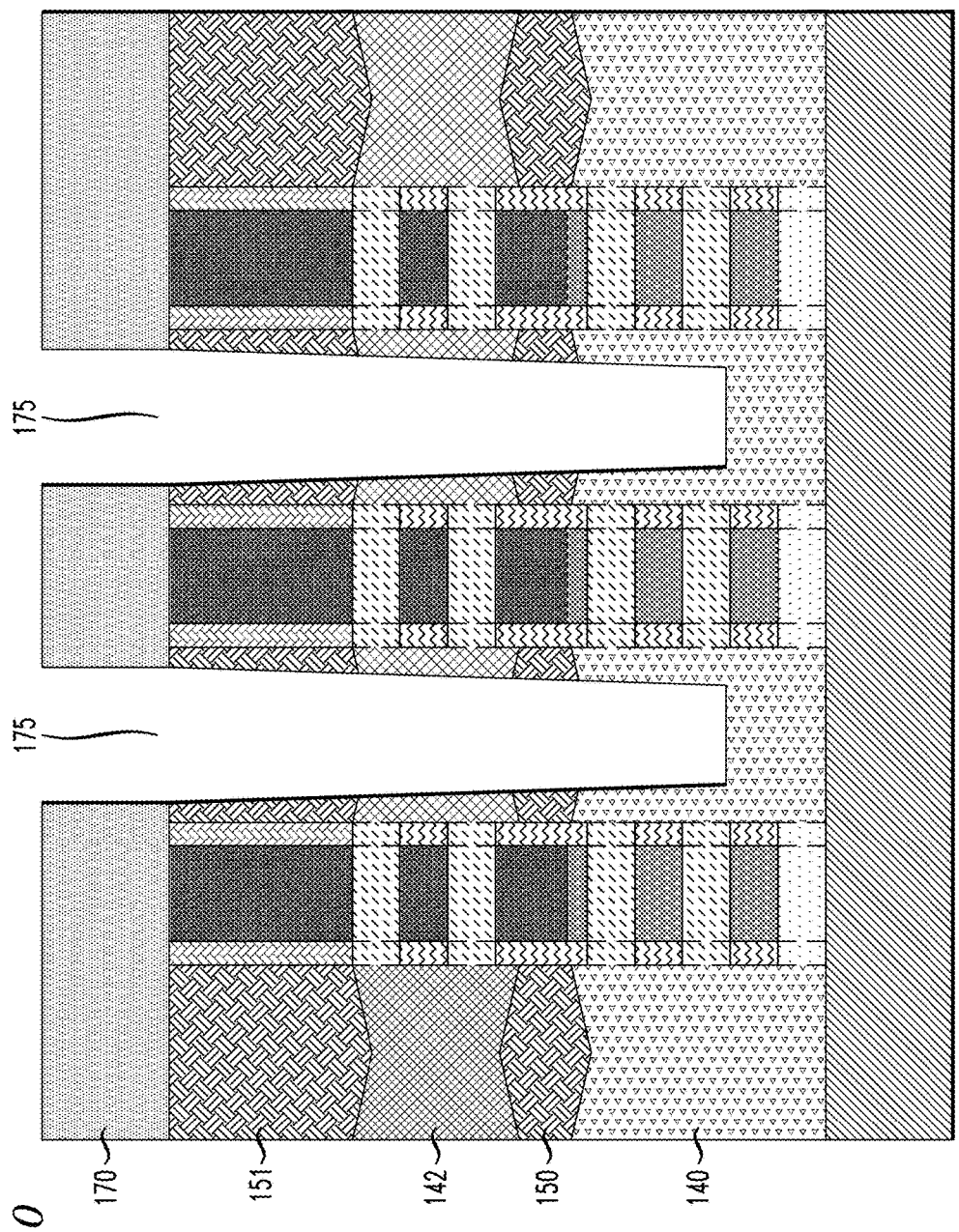
FIG. 10 is a schematic cross-sectional view illustrating manufacturing of a transistor device and showing formation of contact area trenches, according to an embodiment of the invention.

FIG. 10 is a schematic cross-sectional view illustrating manufacturing of a transistor device and showing formation of contact area trenches, according to an embodiment of the invention. Referring to FIG. 10, source/drain contacts can be formed by etching contact area trenches 175 through the ILD layer and dielectric layers 151, 150 and through the upper source/drain region 142 and part of the lower source/drain region 140. A resist 170 covers portions of the structure that will not be etched, and includes openings exposing those portions where the contact area trenches 175 are to be formed. The etching can be performed using, for example, common non-selective Si and SiO$_2$ RIE chemistries, such as CH$_x$F$_y$.

Figure 11:
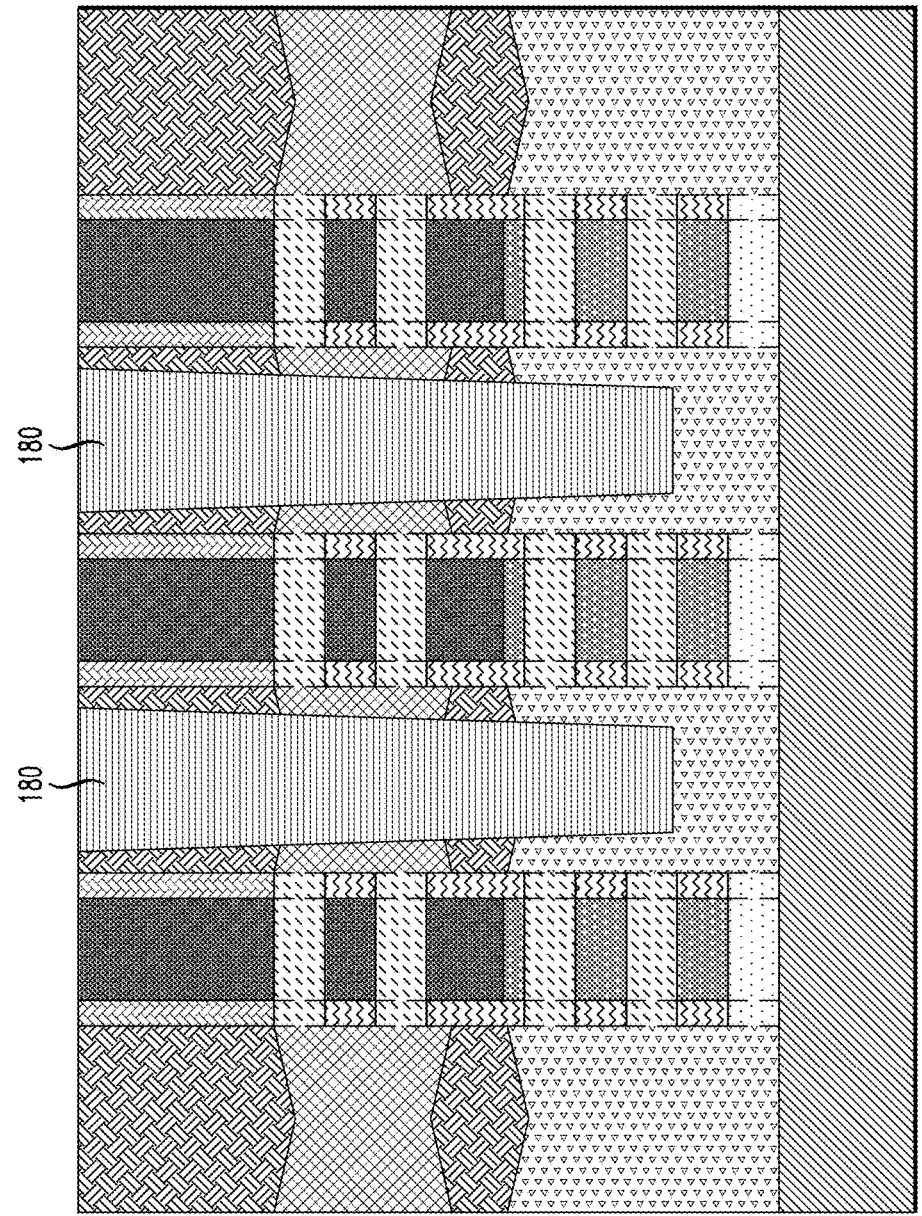
FIG. 11 is a schematic cross-sectional view illustrating manufacturing of a transistor device and showing contact formation, according to an embodiment of the invention.

FIG. 11 is a schematic cross-sectional view illustrating manufacturing of a transistor device and showing contact formation, according to an embodiment of the invention. Referring to FIG. 11, the trenches 175 are filled with a contact material, such as, for example, electrically conductive material including, but not necessarily limited to, tungsten, cobalt, zirconium, tantalum, titanium, aluminum, ruthenium, and/or copper. A silicide/germanide layer may be formed in the trenches before filling a remaining portion of the trenches with the electrically conductive material to form the contact regions/areas 180. The silicide/germanide layer may be formed in the trenches by, for example, silicidation (e.g., formation of an alloy including a portion of a contact material with an exposed underlying or side portions of a silicon or germanium layer), before filling the trenches with a remainder of electrically conductive material. Excess materials from the contact areas 180 formed above the top surface of the ILD layer 151 can be removed utilizing a planarization process, such as CMP.

Figure 12:
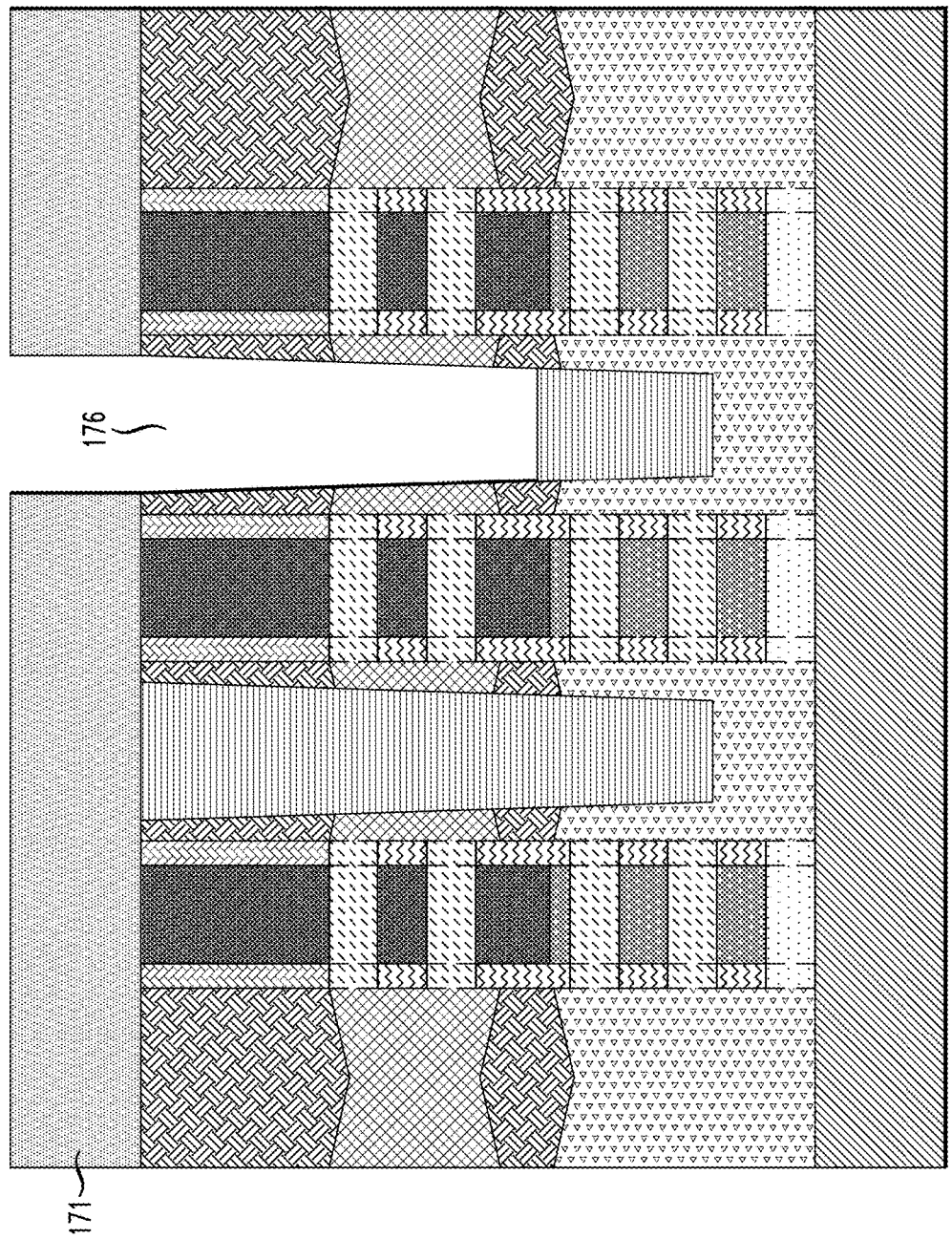
FIG. 12 is a schematic cross-sectional view illustrating manufacturing of a transistor device and showing recessing of a contact area to form a contact area trench for where a source/drain region is not shared between two devices, according to an embodiment of the invention.

FIG. 12 is a schematic cross-sectional view illustrating manufacturing of a transistor device and showing recessing of a contact area to form a contact area trench for where a source/drain region is not shared between two devices, according to an embodiment of the invention. Referring to FIG. 12, for a situation where a source/drain region is not shared between two devices (e.g., between NFET and PFET devices), the contact area 180 can be etched back to form trench 176 through the ILD layer 151, the upper source/drain region 142 and part of the dielectric layer 150. A resist 171 covers portions of the structure that will not be etched, and includes an opening exposing the portions where the trench 176 is to be formed. The etching can be performed using, for example, common non-selective Si and $SiO_2$ RIE chemistries, such as $CH_xF_y$.

Figure 13:
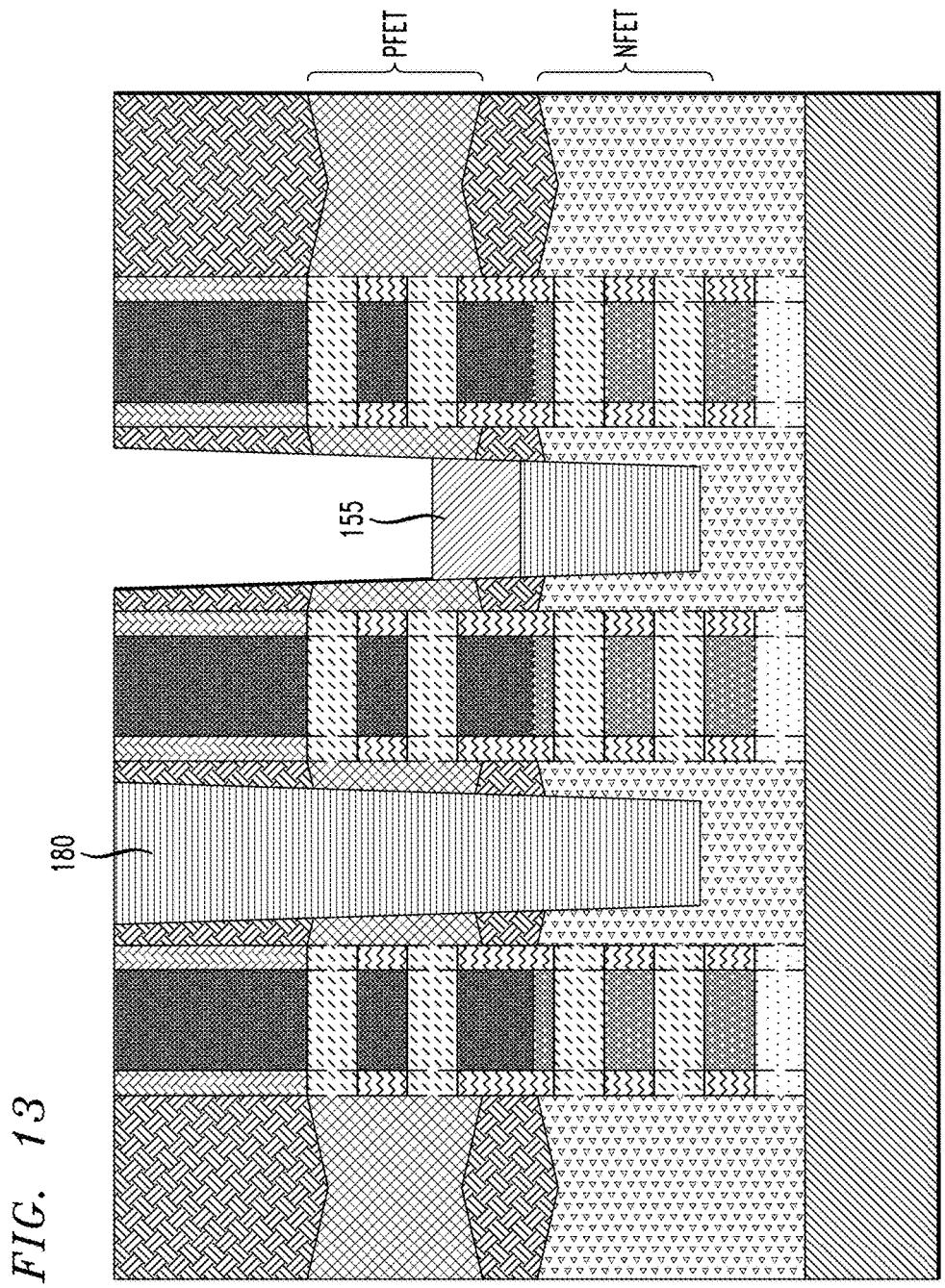
FIG. 13 is a schematic cross-sectional view illustrating manufacturing of a transistor device and showing formation of a dielectric layer in a contact area trench between complementary transistors, according to an embodiment of the invention.

FIG. 13 is a schematic cross-sectional view illustrating manufacturing of a transistor device and showing formation of a dielectric layer in a contact area trench between complementary transistors, according to an embodiment of the invention. Referring to FIG. 13, a dielectric layer 155, including, but not necessarily limited to, silicon dioxide ($SiO_2$), low-temperature oxide (LTO), high-temperature oxide (HTO), field oxide (FOX) or some other dielectric is deposited in the trench 176 on the recessed contact area 180. The dielectric layer 155 can be deposited using, for example, CVD, PECVD, RFCVD, PVD, ALD, MLD, MBD, PLD, LSMCD, and/or sputtering, followed by planarization by, for example, CMP, down to the ILD layer 151. The dielectric layer 155 is then recessed using, for example, an etching process, to an area corresponding to a bottom portion of the source/drain epitaxial region 142 so that the dielectric layer 155 can isolate the upper source/drain epitaxial region 142 from the lower source/drain epitaxial region 140 in the right side contact region. The recessing is performed using, for example an HF-based solution or $CH_xF_y$ based ME.

Figure 14:
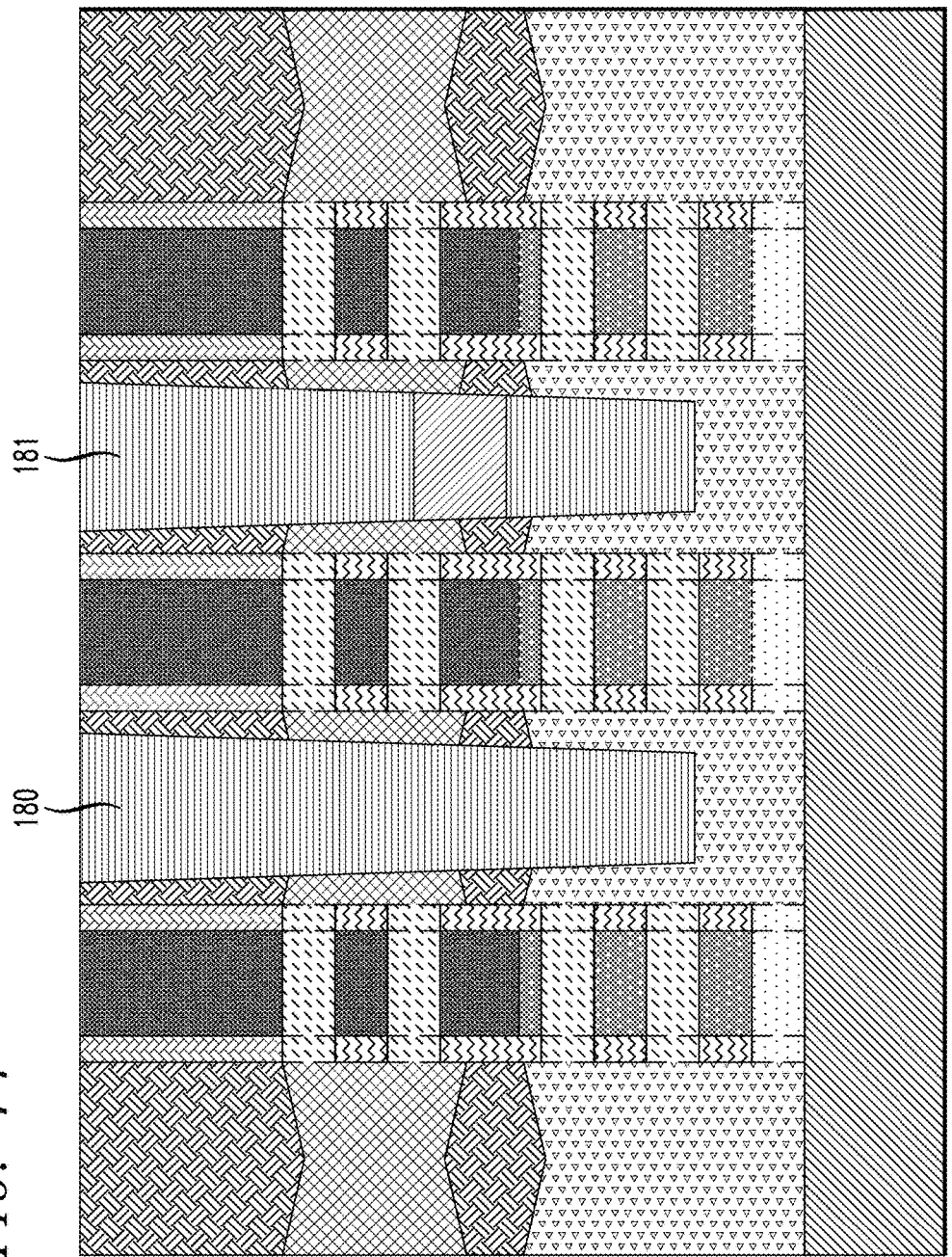
FIG. 14 is a schematic cross-sectional view illustrating manufacturing of a transistor device and showing contact formation where a source/drain region is not shared between two devices, according to an embodiment of the invention.

FIG. 14 is a schematic cross-sectional view illustrating manufacturing of a transistor device and showing contact formation where a source/drain region is not shared between two devices, according to an embodiment of the invention. Referring to FIG. 14, the remaining portion of the trench 176 is filled with a contact material, such as, for example, electrically conductive material including, but not necessarily limited to, tungsten, cobalt, zirconium, tantalum, titanium, aluminum, ruthenium, and/or copper. A silicide/germanide layer may be formed in the trenches before filling a remaining portion of the trenches with the electrically conductive material to form contact region 181. The silicide/germanide layer may be formed in the trenches by, for example, silicidation (e.g., formation of an alloy including a portion of a contact material with exposed side portions of a silicon or germanium layer), before filling the trenches with a remainder of electrically conductive material. Excess materials from the contact area 181 formed above the top surface of the ILD layer 151 can be removed utilizing a planarization process, such as CMP. The dielectric layer 155 isolates the lower source/drain epitaxial region 140 from the upper source/drain epitaxial region 142 in the right side contact region, including contact areas 181 and 180, to result in a source/drain regions that are not shared between stacked complementary transistors. In the left side contact region, the contact area 180 extends through both the upper and lower source/drain epitaxial regions 142, 140 so that the source/drain regions in the left side contact region are shared between the stacked complementary transistors. In accordance with an embodiment of the present invention, contact to the lower source/drain region 140 on the right side in the drawing in FIG. 14 may be formed at, for example, ends of the source/drain region 140 found in or out of the page.

Figure 15:
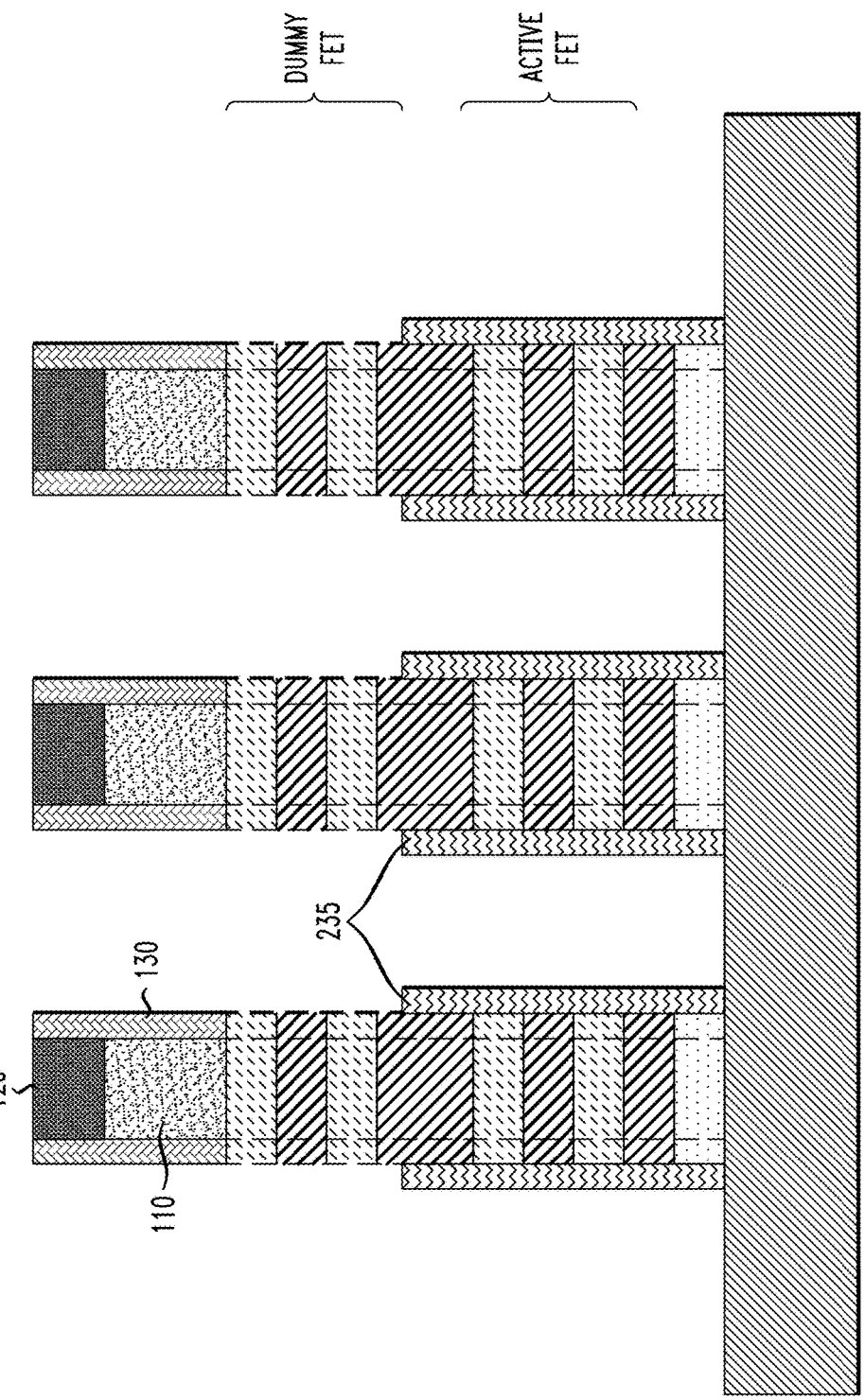
FIG. 15 is a schematic cross-sectional view illustrating manufacturing of a transistor device and showing formation of recessed spacers to encapsulate portions of the patterned stacks where active transistors will be formed, according to an embodiment of the invention.

FIG. 15 is a schematic cross-sectional view illustrating manufacturing of a transistor device and showing formation of recessed spacers to encapsulate portions of the patterned stacks where active transistors will be formed, according to an embodiment of the invention. Referring to FIG. 15, which follows from FIG. 3 discussed herein above, recessed spacers 235 are formed on sides of the patterned Si/SiGe stacks encapsulating portions of the patterned Si/SiGe stacks where active transistors will be formed. According to an embodiment, a dielectric, such as, for example, silicon oxide, silicon nitride, silicon oxynitride, boron nitride, silicon boron nitride, or multilayered stacks thereof, is deposited conformally on the patterned SiGe/Si stacks, as well on the substrate 102. As shown in FIG. 15, the horizontal portions of the dielectric material are then removed, and then the remaining portion is recessed to a height below a dummy device region using, for example, etching, to form spacers 235. Deposition of the spacer material can be performed using one or more conformal deposition techniques including, but not necessarily limited to, CVD or ALD.

Figure 16:
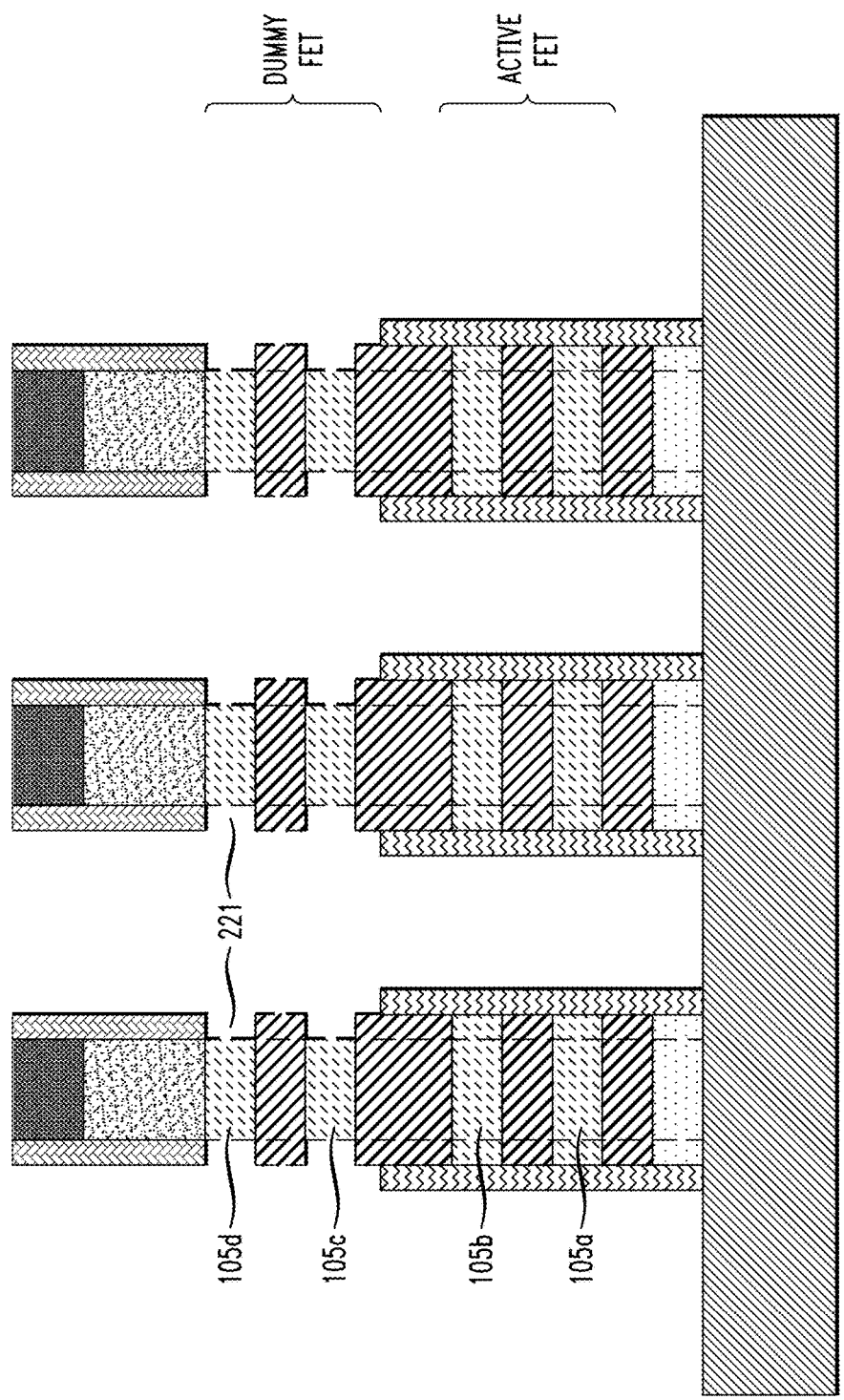
FIG. 16 is a schematic cross-sectional view illustrating manufacturing of a transistor device and showing recessing of upper silicon portions of the patterned stacks corresponding to dummy transistors, according to an embodiment of the invention.

FIG. 16 is a schematic cross-sectional view illustrating manufacturing of a transistor device and showing recessing of upper silicon portions of the patterned stacks corresponding to dummy transistors, according to an embodiment of the invention. Referring to FIG. 16, prior to epitaxial growth, side portions of the Si layers 105c-105d in a dummy device region are removed to create vacant areas 221 which will be eventually replaced with spacers 233 as discussed further herein in connection with FIGS. 19 and 20, so that the Si layers 105c-105d are covered during the epitaxial growth of the source/drain layers 240 and lateral epitaxial growth does not occur from the Si layers 105c-105d of the patterned stacks. The removal process to create vacant areas 221 can be performed using cyclic $NH_4OH:H_2O_2:H_2O$ (to chemically oxidize the Si to a thickness of, for example, about 1 nm-about 2 nm) and diluted $HF:H_2O$ 50-100:1 to remove the chemical oxide. The spacers 235 function as a mask by covering the Si layers 105a and 105b to prevent removal of side portions of the Si layers 105a and 105b in an active device region.

Figure 17:
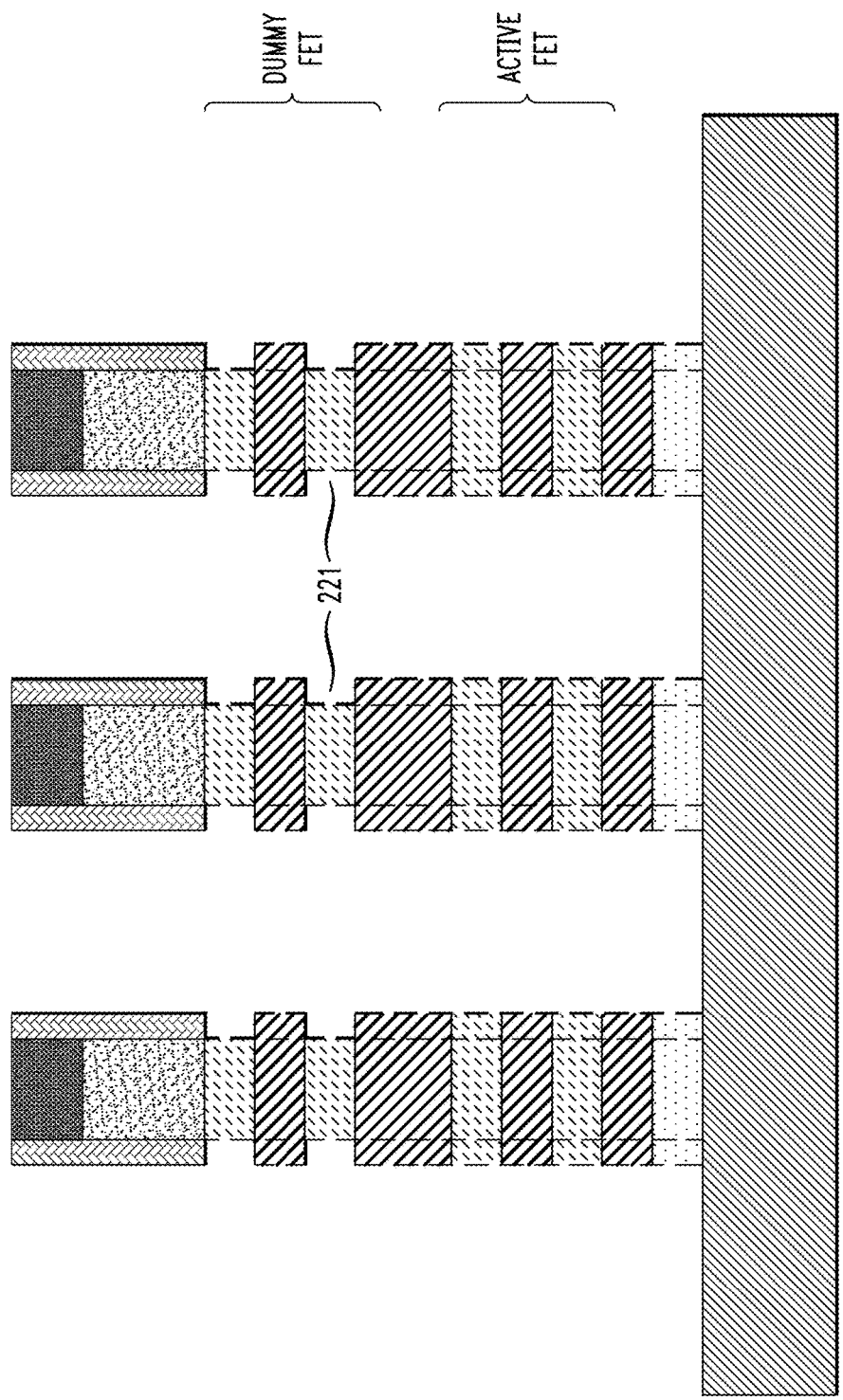
FIG. 17 is a schematic cross-sectional view illustrating manufacturing of a transistor device and showing removal of the recessed spacers, according to an embodiment of the invention.

FIG. 17 is a schematic cross-sectional view illustrating manufacturing of a transistor device and showing removal of the recessed spacers, according to an embodiment of the invention. Referring to FIG. 17, a selective wet stripping process is used to selectively remove the spacers 235. The strip process can be performed using, for example, diluted HF in $H_2O$ if the second spacer is oxide, and time controlled hot phosphoric acid if the second spacer is nitride.

Figure 18:
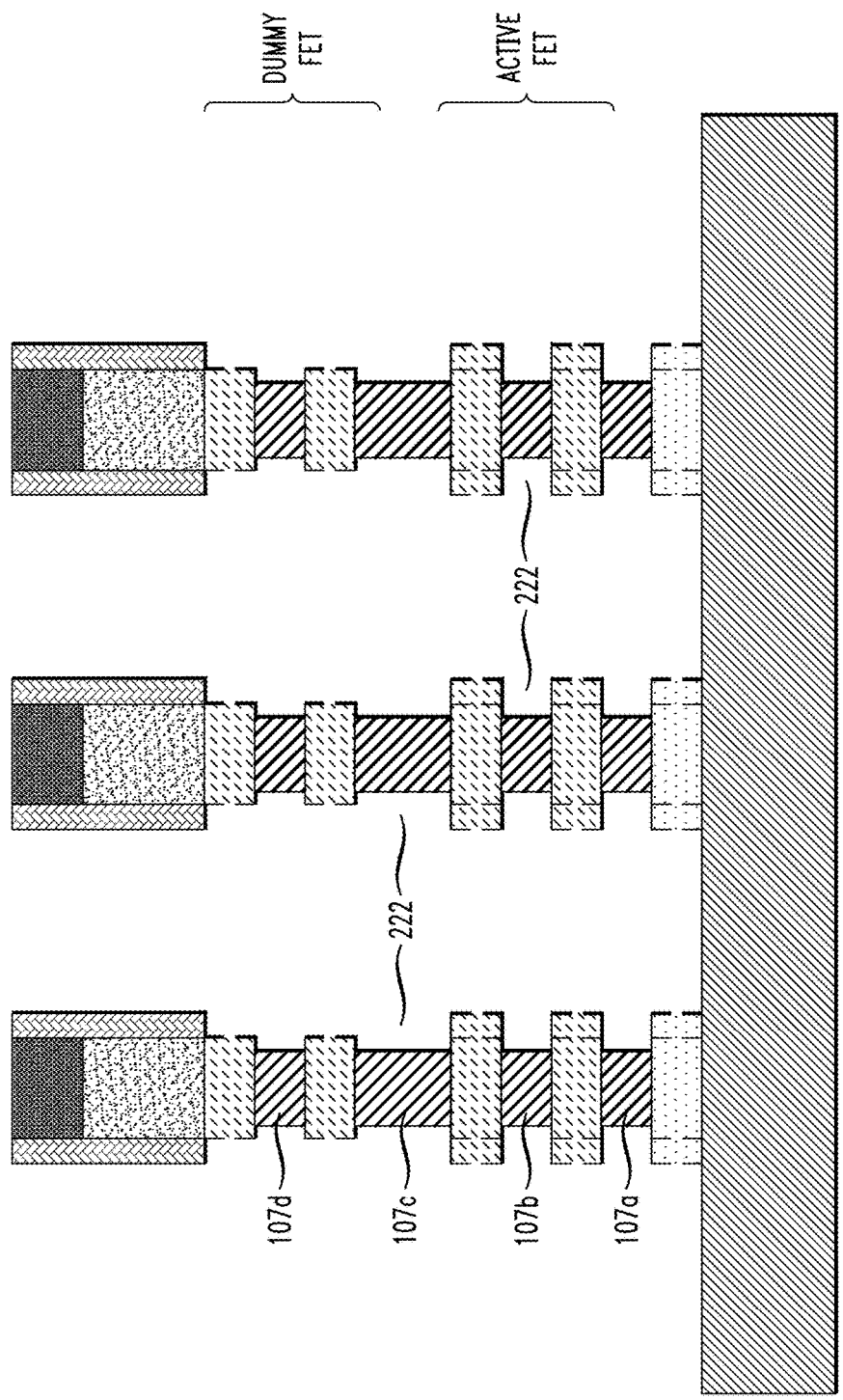
FIG. 18 is a schematic cross-sectional view illustrating manufacturing of a transistor device and showing recessing of upper and lower silicon germanium portions of the patterned stacks corresponding to dummy and active transistors, according to an embodiment of the invention.

FIG. 18 is a schematic cross-sectional view illustrating manufacturing of a transistor device and showing recessing of upper and lower silicon germanium portions of the patterned stacks corresponding to dummy and active transistors, according to an embodiment of the invention. Referring to FIG. 18, prior to epitaxial growth, side portions of the SiGe layers 107a-107d in active and dummy device regions are removed to create vacant areas 222 which will be eventually replaced with spacers 233 as discussed further herein in connection with FIGS. 19 and 20, so that the SiGe layers 107a-107d are covered during the epitaxial growth of the source/drain layers 240 and lateral epitaxial growth does not occur from the SiGe layers 107a-107d of the patterned stacks.

The removal process to create vacant areas 222 can be performed using cyclic $NH_4OH:H_2O_2:H_2O$ (to chemically oxidize the SiGe) and diluted $HF:H_2O$ 50-100:1 to remove the chemical oxide. A gas-phase HCl based dry etch can be also used. According to an embodiment, due to the germanium in layers 107a-107d, etching of the layers 107a-107d can be performed selective to layers 104 and 105a-105d, such that the side portions of the SiGe layers 107a-107d can be removed, without removing material from the layers 104 and 105a-105d. The etching can be performed using, for example, $NH_4OH:H_2O_2$ solution.

Figure 19:
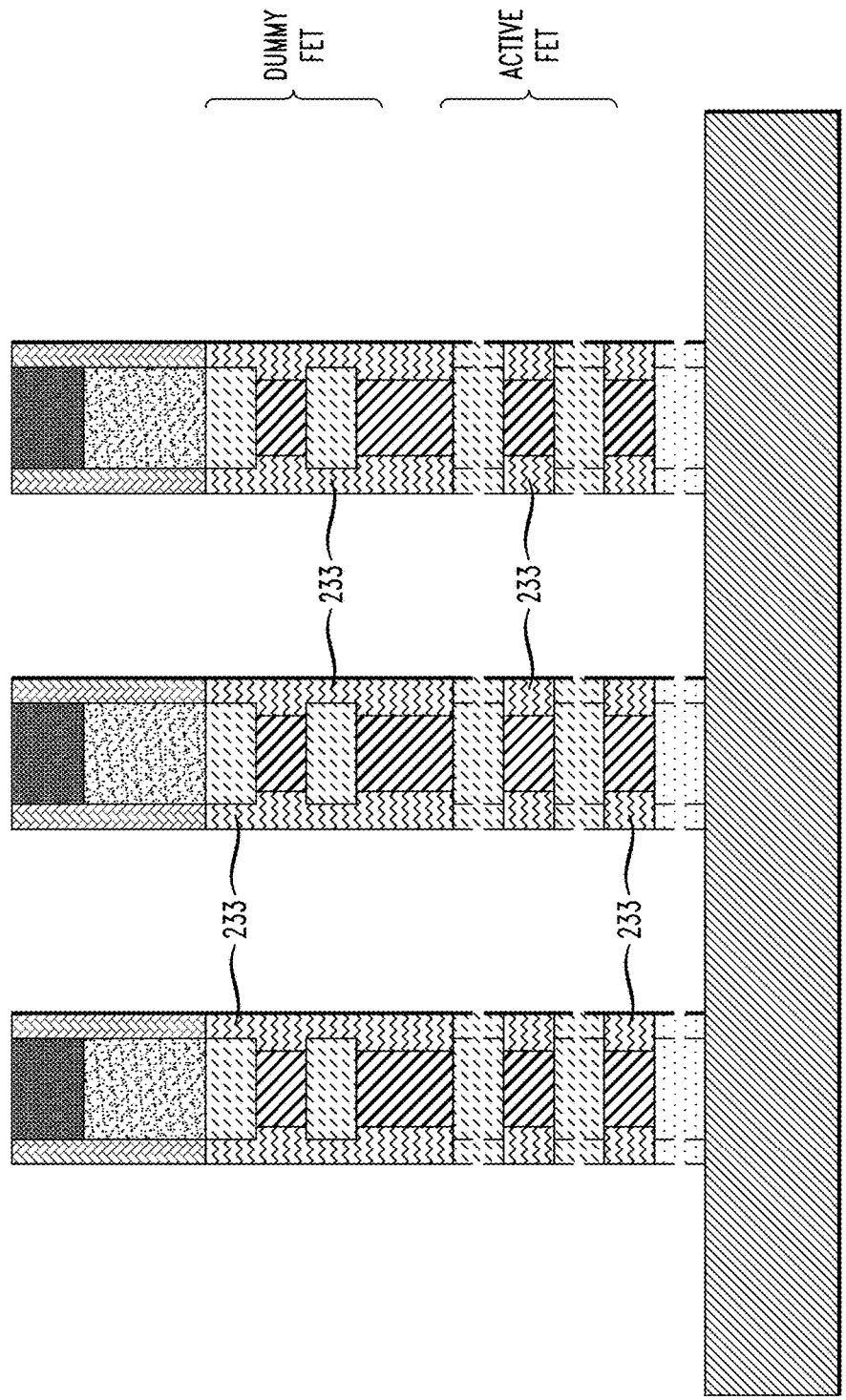
FIG. 19 is a schematic cross-sectional view illustrating manufacturing of a transistor device and showing formation of inner spacers to isolate upper portions of the patterned stacks corresponding to dummy transistors and lower silicon germanium portions of the patterned stacks corresponding to active transistors, according to an embodiment of the invention.

FIG. 19 is a schematic cross-sectional view illustrating manufacturing of a transistor device and showing formation of inner spacers to isolate upper portions of the patterned stacks corresponding to dummy transistors and lower silicon germanium portions of the patterned stacks corresponding to active transistors, according to an embodiment of the invention. Referring to FIG. 19, in accordance with an embodiment of the present invention, the vacant portions 221 and 222 left by removal of the side portions of the layers 105c-105d and 107a-107d are filled in by deposition of dielectric material forming spacers 233. The spacers 233 include a dielectric, such as, for example, silicon oxide, silicon nitride, silicon oxynitride, boron nitride, silicon boron nitride, or multilayered stacks thereof to fill in the gaps 221 and 222 left after etching side portions of the layers 105c-105d and 107a-107d. The material of the spacers 233 can be the same or similar to the material of the spacers 130. Deposition of the spacers 233 can be performed using deposition techniques including, but not necessarily limited to, CVD, PECVD, RFCVD, PVD, ALD, MBD, PLD, and/or LSMCD, sputtering, and/or plating, followed by dry and wet etch processes to remove excess deposited material of the spacers 233. The wet etch process may be performed using, for example, diluted high temperature phosphoric acid and hydrofluoric (HF) acid to remove excess materials.

The spacers 233 cover the Si layers 105c-105d and the SiGe layers 107a-107d during the epitaxial growth of the source/drain layers 240 and lateral epitaxial growth does not occur from the Si layers 105c-105d and the SiGe layers 107a-107d of the patterned stacks.

Figure 20:
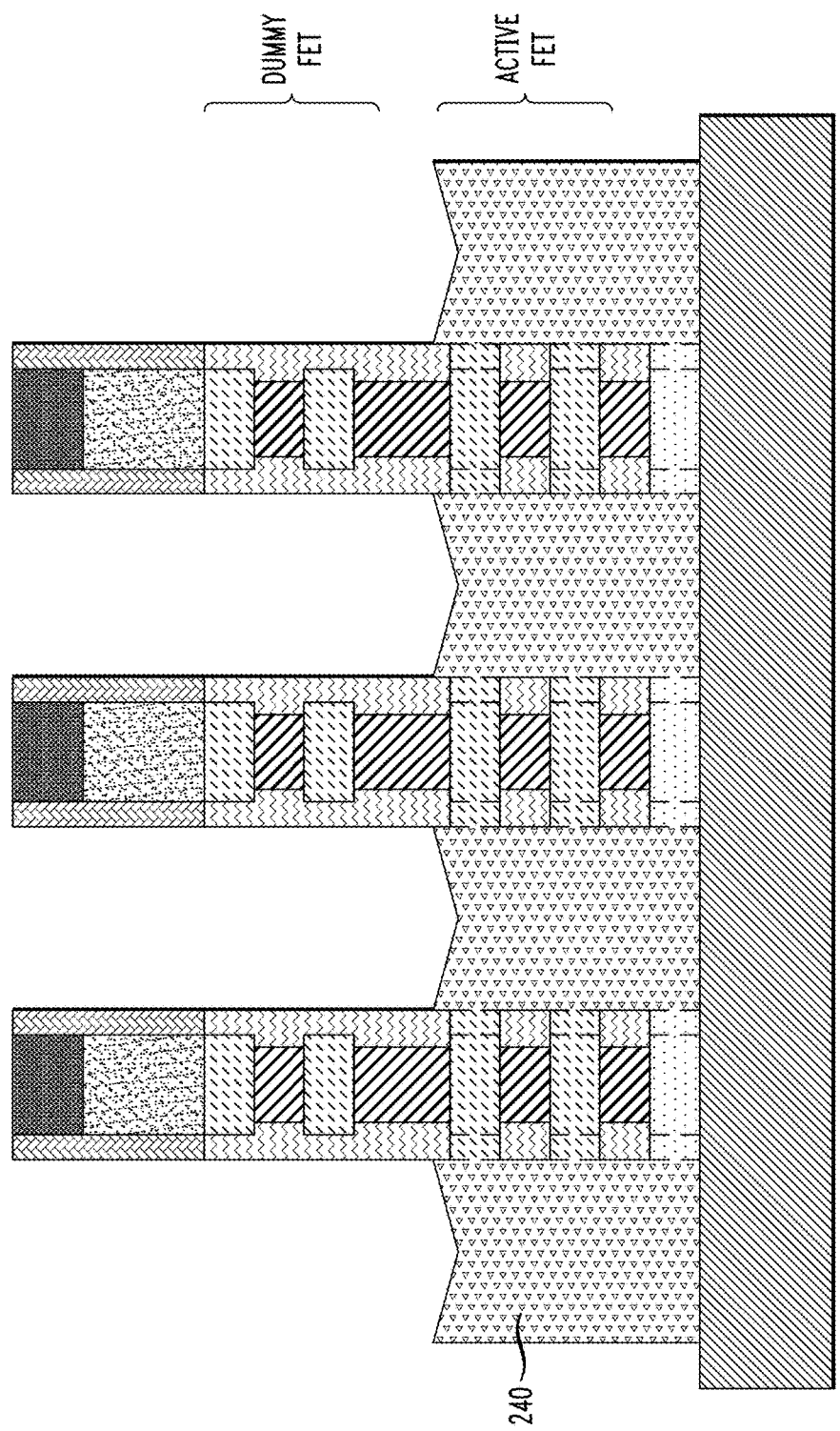
FIG. 20 is a schematic cross-sectional view illustrating manufacturing of a transistor device and showing formation of source/drain epitaxial layers between the patterned stacks in area corresponding to active transistors, according to an embodiment of the invention.

FIG. 20 is a schematic cross-sectional view illustrating manufacturing of a transistor device and showing formation of source/drain epitaxial layers between the patterned stacks in area corresponding to active transistors, according to an embodiment of the invention. Referring to FIG. 20, source/drain epitaxial layers 240 are laterally grown from the exposed silicon regions 105a-105b of the patterned Si/SiGe stacks. Since the upper dummy device region is fully isolated by the spacers 233, the epitaxial source/drain layers 240 are limited to the designated active device region to become the source/drain regions for the lower devices, which can be, for example, NFETs or PFETs. In the case of NFETs, the epitaxial layers 240 can comprise, but are not necessarily limited to, in-situ phosphorous doped (ISPD) Si:C, where the concentration of phosphorus is 1e20 $cm^{-3}$-5e21 $cm^{-3}$. In the case of PFETs, the epitaxial layers 240 can comprise, but are not necessarily limited to, in-situ boron doped (ISBD) SiGe, where the concentration of boron is 1e20 $cm^{-3}$-5e21 $cm^{-3}$.

Figure 21:
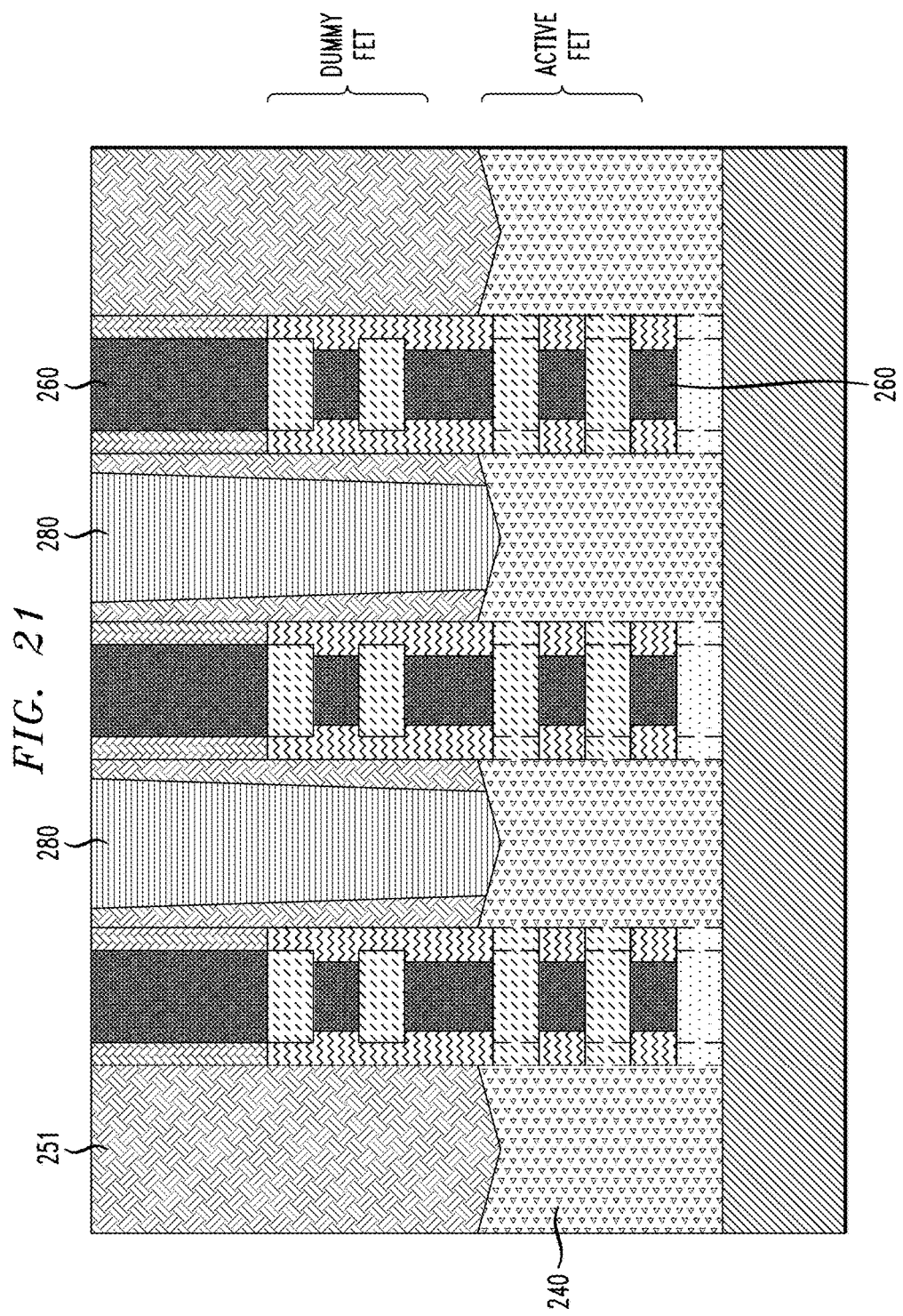
FIG. 21 is a schematic cross-sectional view illustrating manufacturing of a transistor device and showing formation of contact areas and gate structures after formation of ILD layers, according to an embodiment of the invention.

FIG. 21 is a schematic cross-sectional view illustrating manufacturing of a transistor device and showing formation of contact areas and gate structures after formation of an ILD layer, according to an embodiment of the invention. Referring to FIG. 21, ILD layers 251, including, but not necessarily limited to, silicon dioxide ($SiO_2$), low-temperature oxide (LTO), high-temperature oxide (HTO), field oxide (FOX) or some other dielectric are deposited on the epitaxial source/drain layers 240 to fill in the vacant areas between the patterned SiGe/Si stacks and the dummy gate and hardmask layers 110, 120. The ILD layers 251 can be deposited using, for example, CVD, PECVD, RFCVD, PVD, ALD, MLD, MBD, PLD, LSMCD, and/or sputtering, followed by planarization by, for example, CMP, down to the hardmask layers 120.

Then, similar to the processing described in connection with FIG. 9, gate regions 260 are formed in place of selectively removed hardmask layers 120, dummy gates 110 and SiGe layers 107a-107d. Unlike what is described in connection with FIG. 9, the gate regions 260 formed in the dummy and active regions comprise the same material in upper and lower portions, which correspond to the dummy and active regions.

In accordance with an embodiment of the present invention, similar to the gate regions 160 and 165, the gate regions 260 each include a gate dielectric layer such as, for example, a high-K dielectric layer, a work-function metal (WFM) layer which can be deposited on the gate dielectric layer, and a gate layer deposited on the WFM layer and the gate dielectric layer. The layers for the gate regions 260 can be deposited using, for example, CVD, PECVD, RFCVD, PVD, ALD, MLD, MBD, PLD, LSMCD, and/or sputtering, followed by planarization by, for example, CMP.

According to an embodiment of the invention, source/drain contacts 280 can be formed by etching contact area trenches through the ILD layers 251 to reach the source/drain region 240. Processing to form the contact regions/areas 280 is similar to the processing to form contact regions 180 described in connection with FIGS. 10 and 11. Contact material, such as, for example, electrically conductive material, and a silicide/germanide layer may be formed in the trenches to form contact areas 280. Excess materials from the contact areas 280 formed above the top surface of the ILD layer 251 can be removed utilizing a planarization process, such as CMP. As can be seen, the contact areas 280 extend through the dummy device region, where there was no source/drain epitaxial growth, to contact the source/drain epitaxial region 240 in the active device region.

Figure 22:
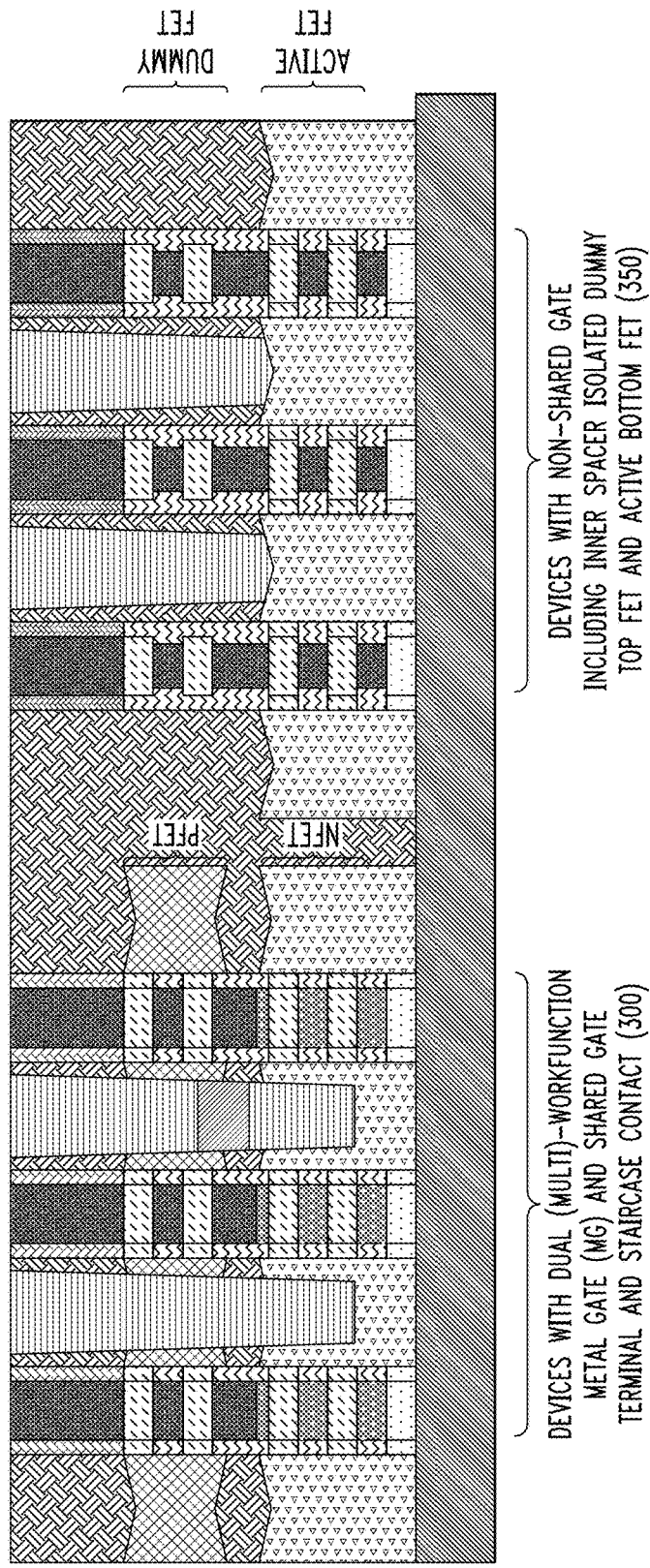
FIG. 22 is a schematic cross-sectional view illustrating a transistor device including devices with multi-workfunction metal gates and a shared gate terminal, and devices with a non-shared gate terminal and dummy top and active bottom transistors, according to an embodiment of the invention.

FIG. 22 is a schematic cross-sectional view illustrating a transistor device including devices 300 with multi-work-function metal gates and a shared gate terminal, and devices 350 with a non-shared gate terminal and dummy top and active bottom transistors, according to an embodiment of the invention. Referring to FIG. 22, the left side devices 300 include a shared gate terminal between PFET and NFET devices, and can include a shared source/drain contact (like contact 180 described in connection with FIG. 14) between PFET and NFET devices, and a non-shared source/drain contact (like contact 181 separated from contact 180 by dielectric layer 155 as shown in FIG. 14), which can be referred to as a "staircase" contact. The right side devices 350 include non-shared gate terminals between dummy top and active bottom transistors, where the contact areas (like contact areas 280) extend through the dummy device region, where there was no source/drain epitaxial growth, to contact the source/drain epitaxial region in the active device region.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a stacked configuration of silicon germanium and silicon layers on a semiconductor substrate, wherein the stacked configuration comprises a repeating arrangement of a silicon layer stacked on a silicon germanium layer;
    patterning the stacked configuration into a plurality of patterned stacks spaced apart from each other;
    covering exposed sides of the silicon germanium layers in the plurality of patterned stacks with a dielectric;
    growing a plurality of epitaxial source/drain regions between the plurality of patterned stacks, wherein the epitaxial source/drain regions are grown from exposed sides of the silicon layers in the plurality of patterned stacks;
    selectively removing the silicon germanium layers from the plurality of patterned stacks;
    replacing the removed silicon germanium layers with respective gate regions; and
    forming a contact region to an epitaxial source/drain region of the plurality of epitaxial source/drain regions between the plurality of patterned stacks.

2. The method according to claim 1, further comprising recessing the epitaxial source/drain regions to a lower height between the plurality of patterned stacks corresponding to a first type doped region, wherein the epitaxial source/drain regions are doped with a first type dopant.

3. The method according to claim 2, further comprising forming respective dielectric layers on the recessed epitaxial source/drain regions.

4. The method according to claim 3, further comprising growing a plurality of additional epitaxial source/drain regions between the plurality of patterned stacks, wherein the plurality of additional epitaxial source/drain regions are grown from exposed sides of the silicon layers in the plurality of patterned stacks positioned above the respective dielectric layers.

5. The method according to claim 4, wherein the plurality of additional epitaxial source/drain regions correspond to a second type doped region, and the plurality of additional epitaxial source/drain regions are doped with a second type dopant different from the first type dopant.

6. The method according to claim 5, wherein the contact region extends through an additional epitaxial source/drain region of the plurality of additional epitaxial source/drain regions doped with the second type dopant to the epitaxial source/drain region of the plurality of epitaxial source/drain regions doped with the first type dopant.

7. The method according to claim 5, wherein a first portion of the respective gate regions corresponds to the first type doped region and a second portion of the respective gate regions stacked on the first portion corresponds to the second type doped region.

8. The method according to claim 7, wherein the first and second portions of the respective gate regions comprise different materials from each other, which respectively correspond to the first and second type doped regions.

9. The method according to claim 5, further comprising forming a contact region to an additional epitaxial source/drain region of the plurality of additional epitaxial source/drain regions doped with the second type dopant which is stacked on and electrically isolated from a portion of the contact region to the epitaxial source/drain region of the plurality of epitaxial source/drain regions doped with the first type dopant.

10. The method according to claim 1, further comprising covering exposed sides of a portion of the silicon layers in the plurality of patterned stacks with the dielectric prior to growing the plurality of epitaxial source/drain regions between the plurality of patterned stacks.

11. The method according to claim 10, wherein the portion of the silicon layers whose sides are covered corresponds to a dummy device region.

12. The method according to claim 11, wherein the contact region extends through the dummy device region to the epitaxial source/drain region of the plurality of epitaxial source/drain regions.

13. The method according to claim 12, wherein the plurality of epitaxial source/drain regions correspond to an active device region located under the dummy device region.

14. The method according to claim 11, wherein a first portion of the respective gate regions corresponds to an active device region and a second portion of the respective gate regions stacked on the first portion corresponds to the dummy device region.

15. The method according to claim 10, wherein the portion of the silicon layers whose sides are covered is located above the silicon layers from which the plurality of epitaxial source/drain regions are grown.

16. The method according to claim 1, further comprising forming a plurality of dummy gates spaced apart from each other on the stacked configuration, wherein the plurality of dummy gates cover a portion of the stacked configuration in a channel region.

17. A method for manufacturing a semiconductor device, comprising:
    forming a stacked configuration of first and second semiconductor layers on a semiconductor substrate, wherein the stacked configuration comprises a repeating arrangement of a second semiconductor layer stacked on a first semiconductor layer;
    patterning the stacked configuration into a plurality of patterned stacks spaced apart from each other;
    covering exposed sides of the first semiconductor layers in the plurality of patterned stacks with a dielectric;
    growing a plurality of epitaxial source/drain regions between the plurality of patterned stacks, wherein the epitaxial source/drain regions are grown from exposed sides of the second semiconductor layers in the plurality of patterned stacks;
    selectively removing the first semiconductor layers from the plurality of patterned stacks;
    replacing the removed first semiconductor layers with respective gate regions; and
    forming a contact region to an epitaxial source/drain region of the plurality of epitaxial source/drain regions between the plurality of patterned stacks.

* * * * *